United States Patent [19]

Nakabayashi et al.

[11] Patent Number: 5,498,908
[45] Date of Patent: Mar. 12, 1996

[54] SEMICONDUCTOR APPARATUS HAVING AN N-CHANNEL MOS TRANSISTOR AND A P-CHANNEL MOS TRANSISTOR AND METHOD FOR MANUFACTURING THE SEMICONDUCTOR APPARATUS

[75] Inventors: Takashi Nakabayashi; Takashi Uehara; Akihira Shinohara, all of Osaka, Japan

[73] Assignee: Matsushita Electric Industrial Co., Ltd., Osaka, Japan

[21] Appl. No.: 380,460

[22] Filed: Jan. 30, 1995

Related U.S. Application Data

[63] Continuation of Ser. No. 976,839, Nov. 16, 1992, abandoned.

[30] Foreign Application Priority Data

Nov. 22, 1991  [JP]  Japan ..................... 3-307332

[51] Int. Cl.$^6$ .............................. H01L 29/76; H01L 23/48
[52] U.S. Cl. ........................ 257/751; 257/383; 257/388; 257/412
[58] Field of Search ................................ 257/369, 383, 257/388, 412, 508, 903, 751

[56] References Cited

U.S. PATENT DOCUMENTS 5,014,104  5/1991  Ema ............................... 257/383
5,121,174  6/1992  Forgerson, II et al. .............. 257/280
5,191,402  3/1993  Kondo et al. ........................ 257/288

FOREIGN PATENT DOCUMENTS 3169022  7/1991  Japan.
3203366  9/1991  Japan.

*Primary Examiner*—Rolf Hille
*Assistant Examiner*—Valencia Martin Wallace
*Attorney, Agent, or Firm*—Lowe, Price, LeBlanc & Becker

[57] ABSTRACT

A semiconductor apparatus with MOS transistors for transmitting electrons from an n type source layer to an n type drain layer through a first channel region in an n-channel MOS transistor and transmitting holes from a p type source layer to a p type drain layer through a second channel region in a p-channel MOS transistor consists of a field oxide layer for separating the n-channel MOS transistor from the p-channel MOS transistor, an n type gate electrode mounted on a first gate oxide film arranged on the first channel region, a p type gate electrode mounted on a second gate oxide film arranged on the second channel region and positioned far away from the n type gate electrode to prevent impurities implanted into one of tile gate electrodes from diffusing into the other gate electrode, and a gate metal wiring connecting the gate electrodes through a gate contact hole to miniaturize the transistors.

8 Claims, 10 Drawing Sheets

SEMICONDUCTOR APPARATUS HAVING AN N-CHANNEL MOS TRANSISTOR AND A P-CHANNEL MOS TRANSISTOR AND METHOD FOR MANUFACTURING THE SEMICONDUCTOR APPARATUS

This application is a continuation of application Ser. No. 07/976,839 filed Nov. 16, 1992 now abandoned.

BACKGROUND OF THE INVENTION

1. Field of the Invention

The present invention relates to a semiconductor apparatus with MOS transistors and a method for manufacturing the semiconductor apparatus, and, in particular, to a semiconductor apparatus having an n-channel MOS transistor and a p-channel MOS transistor in which two conductive types of gates are connected with each other and a method for manufacturing the semiconductor apparatus.

2. Description of the Related Art

A large scale integrated semiconductor apparatus has been recently manufactured to process a large number of pieces of data and instructions at a high speed. The apparatus is mainly composed of a large number of metal-oxide-semiconductor (MOS) transistors. Therefore, each of the MOS transistors has been miniaturized so that the gate length of the MOS transistors is lessened to 0.5 µm or below.

In cases where miniaturized MOS transistors are fabricated to form the semiconductor apparatus, a so-called short channel effect is enhanced in each of the MOS transistors. Particularly, the short channel effect is remarkably enhanced in a buried channel type of MOS transistor in which a conducting channel is induced in a region far from a gate oxide film. Therefore, it is impossible to precisely control the amount of drain current transmitted through the conducting channel with gate charge applied to a gate electrode on the gate oxide film. In this case, the gate electrode is generally formed of pollcrystalline silicon because the polycrystalline silicon surpasses aluminium for electrode reliability.

To avoid the enhancement of the short channel effect, a surface channel type of MOS transistor in which a conducting channel is induced at a surface of a silicon substrate has been proposed. That is, the short channel effect is effectively reduced in the surface channel type of MOS transistor.

In addition, in cases where an enhancement type of MOS transistor is fabricated, the relation of work functions between the polycrystalline silicon used as the gate electrode and the silicon substrate must be considered. Therefore, as is well known, an n type polycrystalline silicon gate electrode is required in an n-channel enhancement type of MOS transistor, while a p type polycrystalline silicon gate electrode is required in a p-channel enhancement type of MOS transistor.

Therefore, in cases where a semiconductor apparatus such as a CMOS inverter in which two conductive types of gates are connected is manufactured, an n type polycrystalline silicon gate and a p type polycrystalline silicon gate are inevitably arranged on a semiconductor chip. In this case, the n and p type polycrystalline silicon gates are respectively fabricated by implanting impurities into an intrinsic polycrystalline silicon film by applying an ion implantation technique to achieve a prescribed concentration of the impurities more than a regular value ($10^{19}$ cm$^{-2}$), improved reproductivity of impurity profiles and low-temperature processing.

However, because the impurities are implanted into both the n type polycrystalline silicon gate and the p type polycrystalline silicon gate at a high dose before a heat treatment is performed to activate the n type impurities and the p type impurities, the concentration of the impurities implanted into the gates is considerably low as compared with that in the diffusion technique. Therefore, the resistance of both the n type polycrystalline silicon gate and the p type polycrystalline silicon gate becomes 10 or more times as large as that of the gates doped the impurities by applying the diffusion technique.

Therefore, a wiring structure composed of multi layers has been proposed to prevent the increase of the resistance in the polycrystalline silicon gates. In detail, the multi layers consist of a polycrystalline silicon layer and a metal layer deposited on the polycrystalline silicon layer. In this case, because the metal layer has a low resistance, the resistance of a gate electrode consisting of both the polycrystalline silicon layer and the metal layer is lowered.

However, the impurities are diffused into the metal layer at a high degree because diffusion coefficient for the impurities in metal is considerably high as compared with that for the impurities in the polycrystalline silicon gate. Therefore, the impurities implanted in one of the polycrystalline silicon gates are diffused into the other polycrystalline silicon gate through the metal layer even though a heat treatment is performed to the n type polycrystalline silicon gate to activate the impurities. As a result, work functions of the polycrystalline silicon gates are considerably varied.

Accordingly, there is a drawback that a threshold voltage $V_{th}$ and a transconductance $g_m$ of each of the polycrystalline silicon gates are considerably fluctuated. 2.1. Previously Proposed Art The above drawback is solved in cases where the metal layers deposited on the polycrystalline silicon layers are separated from each other.

A conventional semiconductor apparatus with MOS transistors are described with reference to FIG. 1.

FIG. 1 is a sectional view structurally showing a conventional semiconductor apparatus laid open to public inspection under Japanese Patent Provisional Publication No. 203366/1991 (HEI 3-203366), both a gate region of an n channel MOS transistor and a gate region of a p channel MOS transistor being shown to indicate a boundary region between both gate regions.

As shown in FIG. 1, a conventional semiconductor apparatus 11 is provided with a p type silicon substrate 12 mounting both an n-channel MOS transistor and a p-channel MOS transistor, a p type well region 13 through which electrons are transmitted from a source to a drain in the n-channel MOS transistor, an n type well region 14 through which holes are transmitted from a source to a drain in the p-channel MOS transistor, field oxide layers 15 for separating the n-channel MOS transistor from the p-channel MOS transistor, a first gate oxide film 16 of the p-channel MOS transistor arranged between the field oxide layer 15 for electrically separating a channel in the well region 13 from a gate of the p-channel MOS transistor, a second gate oxide film 17 of the n-channel MOS transistor arranged between the field oxide layer 15 for electrically separating a channel in the well region 14 from a gate of the n-channel MOS transistor, an n type polycrystalline silicon film 18 deposited on the gate oxide film 16 and the field oxide layer 15, a p type polycrystalline silicon film 19 deposited on the gate oxide film 17 and the field oxide layer 15, a first titanium silicide film 20 deposited on the n type polycrystalline silicon film 18, a second titanium silicide film 21 deposited on the p type polycrystalline silicon film 19, a layer insulation film 22 deposited on the titanium silicide films 20, 21, and a metal wiring network 23 deposited on the titanium silicide films 20, 21 and the polycrystalline silicon films 18, 19 through a contact hole 24 opened in the layer insulation film 22.

The n type polycrystalline silicon film 18 is positioned in contact with the p type polycrystalline silicon film 19, while the titanium silicide film 20 is positioned away from the titanium silicide film 21. Therefore, the titanium silicide films 20, 21 and the polycrystalline silicon films 18, 19 are electrically connected with the metal wiring network 23 through the same contact hole 24.

In the above configuration of the conventional semiconductor apparatus 11, signals are transmitted to the polycrystalline silicon films 18, 19 through the metal wiring network 23 and the titanium silicide films 20, 21 to control the MOS transistors mounted on the silicon substrate 12. In this case, although impurities implanted in the polycrystalline silicon film 18 (19) can be diffused into titanium silicide film 20 (21) according to a high diffusion coefficient for the impurities in the titanium silicide films 20, 21, the impurities are not diffused from the silicon film 18 (or 19) to the other silicon film 19 (or 18) because the titanium silicide film 20 is positioned away from the titanium silicide film 21.

Therefore, the resistance of the polycrystalline silicon films 18, 19 is not increased. In addition, because the titanium silicide films 20, 21 with low resistivity are deposited on the polycrystalline silicon films 18, 19, the silicon films 18, 19 with comparatively high resistivity are formed thin. Therefore, the resistance of a gate electrode consisting of both the silicon film 18 and the titanium silicide film 20 is low. Also, the resistance of a gate electrode consisting of both the silicon film 19 and the titanium silicide film 21 is low.

Accordingly, the increase of the resistance of the silicon films 18, 19 is intended to be prevented so that the strength of the signals is not decreased. That is, the MOS transistors mounted on the silicon substrate 12 is intended to be reliably controlled.

However, a p-n junction is formed at a boundary surface between the n type polycrystalline silicon film 18 and the p type polycrystalline silicon film 19.

In this case, when either the n type polycrystalline silicon film 18 or the p type polycrystalline silicon film 19 is applied voltage through the metal wiring network 23, either forward voltage or reverse voltage is applied to the p-n junction. Therefore, either forward current or reverse current passes through the p-n junction so that signals transmitted to the films 18, 19 are not accurately controlled. As a result, there is a drawback that the possibility of faulty operation is increased in the semiconductor apparatus 11 in which two conductive types of films 18, 19 are connected.

In addition, because the n type polycrystalline silicon film 18 is positioned in contact with the p type polycrystalline silicon film 19, the impurities in one of the polycrystalline silicon films 18 (19) are necessarily diffused into the other polycrystalline silicon film 19 (18) although the diffusion length of the impurities in the polycrystalline silicon films 18, 19 is considerably smaller than that in the titanium silicide films 20, 21. For example, after a heat treatment is performed to the n type polycrystalline silicon film 18 at a temperature of 850° C. for 30 minutes to bond the impurities such as arsenic atoms with silicon atoms, the arsenic atoms are diffused by 1 μm or above.

Therefore, as shown in FIG. 2, the arsenic atoms implanted in the n type polycrystalline silicon film 18 are initially diffused into the p type polycrystalline silicon film 19, then the arsenic atoms are deeply diffused into the titanium silicide film 21. Thereafter, the arsenic atoms deeply diffused into the titanium silicide film 21 are again diffused into the p type polycrystalline silicon film 19. Therefore, the arsenic atoms are deeply diffused into the p type polycrystalline silicon film 19. Also, the impurities such as boron atoms implanted in the p type polycrystalline silicon film 19 are initially diffused into the n type polycrystalline silicon film 18, then the boron atoms are deeply diffused into the titanium silicide film 20. Thereafter, the boron atoms deeply diffused into the titanium silicide film 20 are again diffused into the n type polycrystalline silicon film 18. Therefore, the boron atoms are deeply diffused into the n type polycrystalline silicon film 18.

Accordingly, there is a drawback that the strength of signals transmitted to the films 18, 19 are decreased to increase the possibility of faulty operation.

The adverse influence exerted by the diffusion of the impurities is quantitatively examined by Inventors.

FIG. 3 quantitatively shows the variation of subthreshold characteristics in the n-channel transistor of the semiconductor apparatus 11 shown in FIG. 1 in cases where the distance L1 between the p type polycrystalline silicon film 19 and an active region of the n-channel MOS transistor ranges from 1 μm to 4 μm. The active region of the n-channel MOS transistor is just above the first gate oxide film 16.

As shown in FIG. 3, drain current is exponentially increased in proportion to gate voltage at a so-called subthreshold region. These phenomena are called subthreshold characteristics, In cases where the distance L1 between the p type polycrystalline silicon film 19 and the active region of the n-channel MOS transistor is 3 μm or above, the subthreshold characteristics of the n-channel transistor are independent of the distance L1. However, in cases where the distance L1 is 2 μm or below, the subthreshold characteristics of the n-channel transistor are dependent on the distance L1. That is, as the distance L1 is decreased, the gate voltage is decreased to get a prescribed drain current.

Therefore, the distance L2 between a contact surface of the polycrystalline silicon films 18, 19 and the titanium silicide film 20, or 21 must be above 1 μm. In other words, the distance L3 between the titanium silicide films 20, 21 must be above 2 μm. That is, the distance between the n type MOS transistor and the P type MOS transistor in the semiconductor apparatus 11 must be necessarily above 4 μm in consideration of a marginal space required to put the wiring network 23 on the titanium silicide films 20, 21.

Accordingly, there is another drawback that the semiconductor apparatus 11 cannot be effectively miniaturized.

In addition, a process for patterning the titanium silicide films 20, 21 is additionally required because the process must be performed independent of other processes. Therefore, an additional photo mask is required to manufacture the semiconductor apparatus 11.

Accordingly, there is an additional drawback that the number of the processes to manufacture the semiconductor apparatus 11 is increased.

2.2 Improved-type of Previously Proposed Art

The above drawbacks are solved in cases where a gate electrode consisting of a polycrystalline silicon film and a metal layer is separated from another gate electrode consisting of another polycrystalline silicon film and another metal layer.

FIG. 4 is a sectional view structurally showing a conventional semiconductor apparatus laid open to public inspection under Japanese Patent Provisional Publication No. 169022/1991 (HEI 3-169022), both a gate region of an n channel MOS transistor and a gate region of a p channel MOS transistor being shown to indicate a boundary region between both gate regions.

As shown in FIG. 4, a conventional semiconductor apparatus 31 is provided with the p type silicon substrate 12, the p type well region 13, the n type well region 14, the field oxide layer 15, the first and second gate oxide films 16, 17 in the same manner as the semiconductor apparatus 11.

In addition, the semiconductor apparatus 31 is further provided with an n type polycrystalline silicon film 32 deposited on the gate oxide film 16 and the field oxide layers 15 for receiving a signal to control the electrons transmitted in the p type well region 13, a p type polycrystalline silicon film 33 deposited on the gate oxide film 17 and the field oxide layer 15 for receiving a signal to control the holes transmitted in the n type well region 14, a tungsten silicide film 34 deposited on the n type polycrystalline silicon film 32, a tungsten silicide film 35 deposited on the p type polycrystalline silicon film 33, a layer insulation film 36 for insulating the polycrystalline silicon films 32, 33 from polycrystalline silicon films (not shown) of other MOS transistors (not shown) mounted on the silicon substrate 12, and a metal wiring network 37 deposited on the tungsten silicide films 34, 35 through contact holes 38 opened in the layer insulation film 36.

The n type polycrystalline silicon film 32 is positioned away from the p type polycrystalline silicon film 33 through the layer insulation film 36.

In the above configuration of the conventional semiconductor apparatus 31, signals are transmitted to the polycrystalline silicon films 32, 33 through the metal wiring network 37 and the tungsten silicide films 34, 35 to control the MOS transistors mounted on the silicon substrate 12. In this case, because the n type polycrystalline silicon film 32 is positioned away from the p type polycrystalline silicon film 33, impurities implanted in the silicon film 32 (or 33) are not diffused into the other silicon film 33 (or 32). Accordingly, the strength of the signals transmitted to the gate electrodes is not decreased so that the MOS transistors mounted on the silicon substrate 12 can be reliably controlled.

2—2 Problems to be Solved by the Invention

However, the semiconductor apparatus 31 with the MOS transistors requires a plurality of contact holes 38 to transmit the signals to the polycrystalline silicon films 32, 33 because the n type polycrystalline silicon film 32 is positioned away from the p type polycrystalline silicon film 33. That is, as shown in FIG. 4, two contact holes 38 are required in the apparatus 31 with MOS transistors, while the single contact hole 24 is required in cases where the n type polycrystalline silicon film 18 is positioned in contact with the p type polycrystalline silicon film 19 in the semiconductor apparatus 11 shown in FIG. 1. Therefore, a space for arranging the added contact hole is additionally required with a marginal space. In addition, another space for separating the contact holes from each other is additionally required with another marginal space.

FIG. 5 is a plan view of the contact holes 38 in the conventional semiconductor apparatus 31 shown in FIG. 4 numerically showing a space required for the arrangement of the contact holes 38.

As shown in FIG. 5, in cases where each of the contact holes 38 is 0.6 μm in diameter, the distance S1 between the polycrystalline silicon films 32, 33 is 0.5 μm, the marginal space S2 between the polycrystalline silicon film 32 (33) and the contact hole 38 is 0.3 μm, and the space S3 between the polycrystalline silicon film 32 (33) and the active region positioned just above the gate oxide film 16 (17) is 0.3 μm, the distance S4 between the active regions of the MOS transistors is a minimum of 3.5 μm.

Therefore, the distance between the MOS transistors is prolonged by the added contact hole 38.

Accordingly, there is a drawback that the semiconductor apparatus 31 cannot be effectively miniaturized.

In addition, because the area of the gate electrode consisting of both the silicon film 32 (33) and the tungsten silicide film 34 (35) is enlarged on the field oxide layer 15, parasitic capacity generated in the gate electrode is increased.

Accordingly, there is another drawback that the time-lag of the signals transmitted to the gate electrodes is considerably increased. That is, the semiconductor apparatus 31 with the MOS transistors cannot be accurately controlled.

SUMMARY OF THE INVENTION

A first object of the present invention is to provide, with due consideration to the drawbacks of such a conventional semiconductor apparatus with MOS transistors, a method for manufacturing a semiconductor apparatus having an n-channel MOS transistor and a p-channel MOS transistor in which the distance between the MOS transistors is not increased and impurities in a polycrystalline silicon film are not diffused into another polycrystalline silicon film.

In addition, a second object of the present invention is to provide a semiconductor apparatus having an n-channel MOS transistor and a p-channel MOS transistor which is manufactured by applying the above method.

The first object is achieved by the provision of a method for manufacturing a semiconductor apparatus with metal-oxide-semiconductor (MOS) transistors for transmitting electrons from an n type source layer to an n type drain layer through a first channel in an n-channel MOS transistor region and transmitting holes from a p type source layer to a p type drain layer through a second channel in a p-channel MOS transistor region, comprising the steps of:

forming a field oxide layer on a boundary region between the n-channel MOS transistor region and the p-channel MOS transistor region;

forming a first gate oxide film on the first channel of the n-channel MOS transistor region in contact with the field oxide layer;

forming a second gate oxide film on the second channel of the p-channel MOS transistor region in contact with the field oxide layer;

depositing a polycrystalline silicon film on the first and second gate oxide films and the field oxide layer;

depositing a metal film with a high melting point on the polycrystalline silicon film;

selectively etching both the polycrystalline silicon film and the metal film at a time to form both a first gate electrode arranged on both the first gate oxide film and the field oxide layer and a second gate electrode which is arranged on both the second gate oxide film and the field oxide layer and faces to the first gate electrode through a gate opening formed on the field oxide layer;

implanting n type impurities into the polycrystalline silicon film of the first gate electrode to change the conductive type of the polycrystalline silicon film to an n type at which electrons are movable;
implanting the n type impurities into the n-channel MOS transistor region to form the n type source layer and the n type drain layer;
implanting p type impurities into the polycrystalline silicon film of the second gate electrode to change the conductive type of the polycrystalline silicon film to a p type at which holes are movable;
implanting the p type impurities into the p-channel MOS transistor region to form the p type source layer and the p type drain layer;
depositing an insulating film on the first and second gate electrodes and the field oxide layer on which the gate opening is formed;
selectively digging the insulating film deposited on the gate opening to form a gate contact hole in which the first and second gate electrodes are exposed, the insulating film remaining in the gate opening;
selectively depositing a gate metal wiring in the gate contact hole to electrically connect the first and second gate electrodes exposed in the gate contact hole; and
selectively depositing a plurality of wirings which each are connected with the n type source layer, the n type drain layer, the p type source layer, and the p type drain layer.

In the above steps of the method, when a gate signal is provided to the gate metal wiring, the gate signal is transmitted to the first gate electrode of the n-channel MOS transistor, then the channel is induced by an electric field established between the n type source layer and the n type drain layer. Thereafter, electrons injected in the n type source layer through one of the wirings are transmitted to the n type drain layer through the channel.

Also, when a gate signal is provided to the gate metal wiring, the gate signal is transmitted to the second gate electrode of the p-channel MOS transistor, then the channel is induced by an electric field established between the n type source layer and the n type drain layer. Thereafter, holes injected in the p type source layer through the one of the wirings are transmitted to the p type drain layer through the channel.

Therefore, the semiconductor apparatus composed of the n-channel MOS transistor and the p-channel MOS transistor is manufactured by applying the above method.

In addition, the polycrystalline silicon film and the metal film are patterned and etched at the same time by applying a photolithoglaphy process and an anisotropic dry etching process. Therefore, the method for manufacturing the semiconductor apparatus is simplified.

Also, the single gate contact hole is formed to transmit the gate signal to both the first gate electrode and the second gate electrode. Therefore, the semiconductor apparatus is efficiently miniaturized.

Furthermore, the first gate electrode consisting of both a piece of etched polycrystalline silicon film and a piece of etched metal film is completely separated from the second gate electrode consisting of both remaining piece of etched polycrystalline silicon film and remaining piece of etched metal film through the gate opening. Therefore, the impurities implanted in one piece of etched polycrystalline silicon film are not transmitted to the other piece of etched polycrystalline silicon film. Accordingly, the semiconductor apparatus can be stably operated.

The first object is also achieved by the provision of a method for manufacturing a semiconductor apparatus with metal-oxide-semiconductor (MOS) transistors for transmitting electrons from an n type source layer to an n type drain layer through a first channel in an n-channel MOS transistor region and transmitting holes from a p type source layer to a p type drain layer through a second channel in a p-channel MOS transistor region, comprising the steps of:
forming a field oxide layer on a boundary region between the n-channel MOS transistor region and the p-channel MOS transistor region;
forming a first gate oxide film on the first channel of the n-channel MOS transistor region in contact with the field oxide layer;
forming a second gate oxide film on the second channel of the p-channel MOS transistor region in contact with the field oxide layer;
depositing a polycrystalline silicon film on the first and second gate oxide films and the field oxide layer;
selectively etching the polycrystalline silicon film to form a first polycrystalline silicon film arranged on both the first gate oxide film and the field oxide layer and a second polycrystalline silicon film which is arranged on both the second gate oxide film and the field oxide layer and faces to the first polycrystalline silicon film through a gate opening formed on the field oxide layer;
selectively depositing silicon dioxide layer at a side wall of the first and second polycrystalline silicon films to bury the gate opening with the silicon dioxide layer;
implanting n type impurities into the first polycrystalline silicon film to change the conductive type of the first polycrystalline silicon film to an n type at which electrons are movable;
implanting the n type impurities into the n-channel MOS transistor region to form the n type source layer and the n type drain layer;
implanting p type impurities into the second polycrystalline silicon film to change the conductive type of the second polycrystalline silicon film to a p type at which holes are movable;
implanting the p type impurities into the p-channel MOS transistor region to form the p type source layer and the p type drain layer;
selectively depositing metal films with a high melting point on the first and second polycrystalline silicon films, the n type source and drain layers, and the p type source and drain layers;
depositing an insulating film on the metal films deposited on the first and second polycrystalline silicon films and depositing the insulating film on the silicon dioxide layer deposited in the gate opening;
selectively digging the insulating film on the silicon dioxide layer deposited in the gate opening to form a gate contact hole in which the metal films deposited on the first and second polycrystalline silicon films are exposed;
selectively depositing a gate metal wiring in the gate contact hole to electrically connect the metal films deposited on the first and second polycrystalline silicon films exposed in the gate contact hole; and
selectively depositing a plurality of metal wirings on the metal film deposited on the n type source layer, the metal film deposited on the n type drain layer, the metal film deposited on the p type source layer, and the metal film deposited on the p type drain layer;

In the above steps of the method, when a gate signal is provided to the gate metal wiring, the gate signal is transmitted to the first polycrystalline silicon film through the metal film in the n-channel MOS transistor, then the channel is induced by an electric field established between the n type source layer and the p type drain layer. Thereafter, electrons injected in the n type source layer through one of the wirings are transmitted to the n type drain layer through the channel.

Also, when a gate signal is provided to the gate metal wiring, the gate signal is transmitted to the second polycrystalline silicon film through the metal film in the p-channel MOS transistor, then the channel is induced by an electric field established between the p type source layer and the p type drain layer. Thereafter holes injected in the p type source layer through one of the wirings are transmitted to the p type drain layer through the channel.

Therefore, semiconductor apparatus composed of the n-channel MOS transistor and the p-channel MOS transistor is manufactured by applying the above method.

In addition, the gate opening positioned on the field oxide layer is buried with the silicon dioxide. Therefore, the field oxide layer is not etched when the gate contact hole is digged. Accordingly, a gate current flowing from the gate metal wiring to the first and second polycrystalline films through the metal film is not leaked to a substrate mounting the n-channel and p-channel MOS transistors.

Also, the single gate contact hole is formed to transmit the gate signal to both the first and second polycrystalline silicon films. Therefore, the semiconductor apparatus is efficiently miniaturized.

Furthermore, a gate region consisting of the first polycrystalline silicon film and the metal film in the n-channel MOS transistor is completely separated from another gate region consisting of the second polycrystalline silicon film and the metal film in the p-channel MOS transistor through the gate opening in which the silicon dioxide is deposited. Therefore, the impurities implanted in one of the polycrystalline silicon films are not transmitted to the other polycrystalline silicon film. Accordingly, the semiconductor apparatus can be stably operated.

The second object is achieved by the provision of a semiconductor apparatus with metal-oxide-semiconductor (MOS) transistors for transmitting electrons from an n type source layer to an n type drain layer through a first channel region in an n-channel MOS transistor and transmitting holes from a p type source layer to a p type drain layer through a second channel region in a p-channel MOS transistor, comprising:

a field oxide layer arranged on a boundary region between the n-channel MOS transistor and the p-channel MOS transistor for electrically insulating the n-channel MOS transistor from the p-channel MOS transistor;

a first gate oxide film arranged on the first channel region of the n-channel MOS transistor in contact with the field oxide layer;

a second gate oxide film arranged on the second channel region of the p-channel MOS transistor in contact with the field oxide layer;

an n type polycrystalline silicon film arranged on the first gate oxide and the field oxide layer for receiving a gate signal provided to the n-channel MOS transistor;

a first silicified metal film with a high melting point arranged on the n type polycrystalline silicon film for transmitting the gate signal to the n type polycrystalline silicon film;

a p type polycrystalline silicon film which is arranged on both the second gate oxide and the field oxide layer and faces to one end of the n type polycrystalline silicon through an insulating material positioned on the field oxide film;

a second silicified metal film with a high melting point arranged on the p type polycrystalline silicon film and facing to one end of the first silicified metal film through the insulating material;

a plurality of wirings which each are arranged on the n type source layer, the n type drain layer, the p type source layer, and the p type drain layer;

an insulating film arranged on both the first and second silicified metal films for making a gate contact hole on both one end of the first silicified metal film and one end of the second silicified metal film which face to each other through the insulating material; and a gate metal wiring arranged in the gate contact hole for electrically connecting the first metal film and the second metal film to provide the gate signal to both the n type and p type polycrystalline silicon films through both the first and second silicified metal films.

In the above configuration of the semiconductor apparatus with MOS transistors, to operate the n-channel MOS transistor, a gate signal is provided to the n type polycrystalline silicon film through the gate metal wiring and the first metal film. As a result, a channel is induced by an electric field established between the n type source layer and the n type drain layer. Thereafter, electrons injected in the n type source layer through one of the wirings are transmitted to the n type drain layer through the channel.

Also, to operate the p-channel MOS transistor, a gate signal is provided to the p type polycrystalline silicon film through the gate metal wiring and the second metal film. As a result, a channel is induced by an electric field established between the p type source layer and the p type drain layer. Thereafter, holes injected in the p type source layer through one of the wirings are transmitted to the p type drain layer through the channel.

Therefore, the n-channel MOS transistor and the p-channel MOS transistor are simultaneously operated in the semiconductor apparatus.

In addition, the single gate contact hole is formed to transmit the gate signal to both the first metal film and the second metal film. Therefore, the semiconductor apparatus is efficiently miniaturized.

Also, both the first metal film and the n type polycrystalline silicon film are completely separated from both the second metal film and the p type polycrystalline silicon film through the insulating material. Therefore, the impurities implanted in one polycrystalline silicon film are not transmitted to the other polycrystalline silicon film. Accordingly, the semiconductor apparatus can be stably operated.

BRIEF DESCRIPTION OF THE DRAWINGS

The objects, features and advantages of the present invention will be apparent from the following description taken in conjunction with the accompanying drawings, in which.

DETAIL DESCRIPTION OF THE PREFERRED EMBODIMENTS

Preferred embodiments of a semiconductor apparatus with MOS transistors and a method for manufacturing the semiconductor apparatus with MOS transistors are described with reference to drawings.

1. First Embodiment

A method for manufacturing a semiconductor apparatus with MOS transistors is initially described with reference to FIGS. 6A to 6F.

Figure 6A:
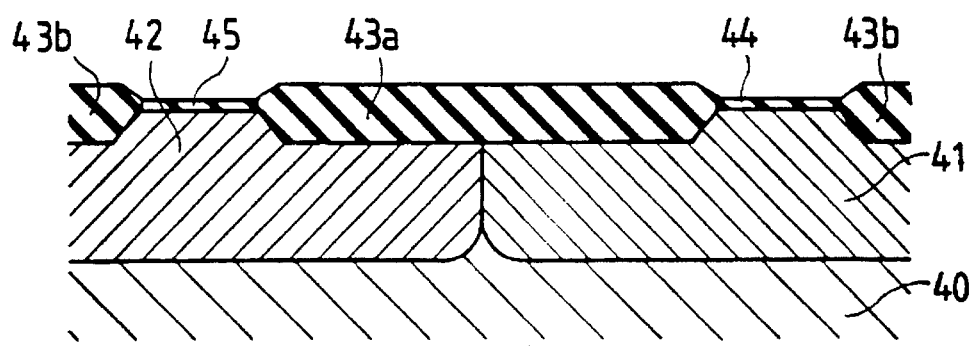
FIG. 6A is a sectional view of layers separating MOS transistors from each other in a semiconductor apparatus with MOS transistors according to a first embodiment of the present invention, initial processes for fabricating the layers being shown.

FIG. 6A is a sectional view of layers separating MOS transistors from each other in a semiconductor apparatus with MOS transistors according to a first embodiment of the present invention, initial processes for fabricating the layers being shown.

As shown in FIG. 6A, impurities such as boron ions are implanted into a part of a p type silicon substrate 40 to form a p type well region 41 by applying a well-known well forming process, and impurities such as phosphorus ions are implanted into another part of the p type silicon substrate 40 to form an n type well region 42 by applying the well forming method. In this case, an n-channel MOS transistor is scheduled to be formed on the p type well region 41. Therefore, an area on the n type well region 42 is called an n-channel MOS transistor zone. Also, a p-channel transistor is scheduled to be formed on the n type well region 42. Therefore, an area on the p type well region 43 is called a p-channel MOS transistor zone. Thereafter, a field oxide layer 43a is formed on a boundary region between the p type well region 41 and the n type well region 42 to separate the n-channel MOS transistor scheduled to be formed on the p type well region 41 from the p-channel transistor scheduled to be formed on the n type well region 42. In addition, other field oxide layers 43b are formed on peripheries of the p type well region 41 and the n type well region 42 to separate the MOS transistors from other devices (not shown) adjacent to the MOS transistors.

Thereafter, a first gate oxide film 44 is formed between the field oxide layer 43a and the field oxide layer 43b to divide the surface of the well region 41 in two. Also, a second gate oxide film 45 is formed between the field oxide layer 43a and the field oxide layer 43b to divide the surface of the well region 42 in two. The first gate oxide film 44 electrically insulates a gate region of the n-channel MOS transistor from it's channel region induced in the p type well region 41, and the second gate oxide film 45 electrically insulates a gate region of the p-channel MOS transistor from it's channel region induced in the n type well region 42. In detail, parts of the surface of the well regions 41, 42 are exposed to dry oxygen at a suitable temperature by applying a well-known dry oxidation process. Therefore, the gate oxide films 44, 45 are formed on the channel regions in a thickness of 10 nm. Also, source regions and drain regions of the MOS transistors are formed in the remaining parts of the surface of the well regions 41, 42 as described later.

In this case, it is preferable that the gate oxidation films 44, 45 be formed by applying a well-known pyro-technic oxidation process in place of the oxidation process.

Figure 6B:
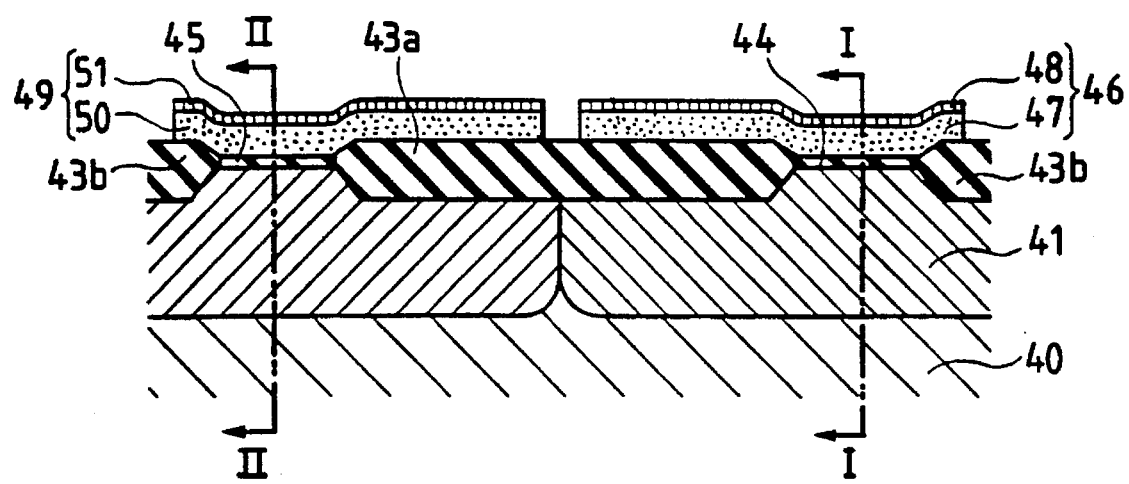
FIG. 6B is a sectional view of gate electrodes of MOS transistors in a semiconductor apparatus with MOS transistors according to the first embodiment of the present invention middle processes for fabricating the gate electrodes on the gate oxide films being shown.

FIG. 6B is a sectional view of gate electrodes of the MOS transistors in the semiconductor apparatus with MOS transistors according to the first embodiment of the present invention, middle processes for fabricating the gate electrodes on the gate oxide films being shown.

As shown in FIG. 6B, after the gate oxide films 44, 45 are formed, polycrystalline silicon is deposited on the field oxide layers 43a, 43b, the gate oxide films 44, 45, and the well regions 41, 42 by applying a well-known vapor deposition process. Therefore, a polycrystalline silicon film is formed in a thickness of 200 nm. Thereafter, tungsten is deposited on the polycrystalline silicon film by applying the vapor deposition process. Therefore, a tungsten film is formed in a thickness of 150 nm. In this case, it is preferable that the tungsten film be formed by applying a well-known sputtering process in place of the vapor deposition process. Also, it is preferable that metal with a high melting point such as molybdenum and the like be deposited in place of the tungsten. In cases where the metal with the high melting point such as the tungsten and the molybdenum is used as a gate electrode, the gate electrode does not deteriorate even though the MOS transistors are operated for a long time.

Thereafter, by applying a well-known photolithoglaphy process, a photoresist film is coated on the tungsten film before the photoresist film is exposed to ultraviolet rays. Therefore, the photoresist film is patterned. Thereafter, the photoresist film, the polycrystalline silicon film and the tungsten film are etched at the same time by applying a well-known anisotropic dry etching process to form a gate opening on the field oxide layer 43a just above a boundary line between the p type well region 41 and the n type well region 42 before the photoresist is washed away. Therefore, a first gate electrode wiring 46 consisting of an etched polycrystalline silicon film 47 and an etched tungsten film 48 is patterned on the first gate oxide film 44 and a part of the field oxide layer 43a. Also, a second gate electrode wiring 49 consisting of an etched polycrystalline silicon film 50 and an etched tungsten film 51 is patterned on the second gate oxide film 45 and a part of the field oxide layer 43a. The width of the gate opening separating the gate electrode wirings 46, 49 from each other is 0.5 μm.

Figure 6C:
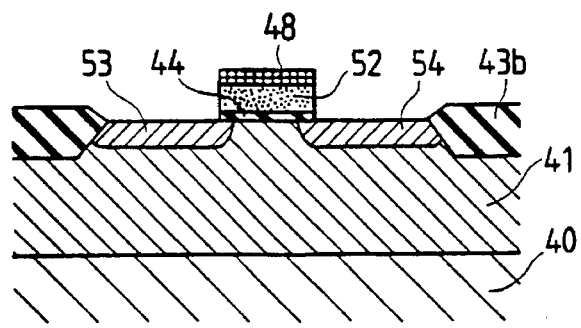
FIG. 6C is a sectional view taken generally along the lines A—A FIG. 6B.

FIG. 6C is a sectional view taken generally along the lines I—I of FIG. 6B.

As shown in FIG. 6C, after a photoresist mask (not shown) is coated over the p-channel MOS transistor zone to prevent impurities from being implanted into the p-channel MOS transistor zone, arsenic ions are implanted into the polycrystalline silicon film 47 and the p type well region 41 at an accelerating energy of 40 keV and a dose of $4.0 \times 10^{15}$ cm$^{-2}$. Therefore, a polycrystalline silicon film 47 is changed to an n-type polycrystalline silicon 52, and the upper side of the p type well region 41 divided by the gate oxide film 44 is changed to an n type diffused layer. In this case, one side of the n type diffused layer divided by the gate oxide film 44 is called an n type source diffused layer 53 because the source diffused layer 53 functions as a source of tile n-channel MOS transistor as described later. Also, the other side of the n type diffused layer divided by the gate oxide film 44 is called an n type drain diffused layer 54 because the drain diffused layer 54 functions as a drain of the n-channel MOS transistor as described later.

Figure 6D:
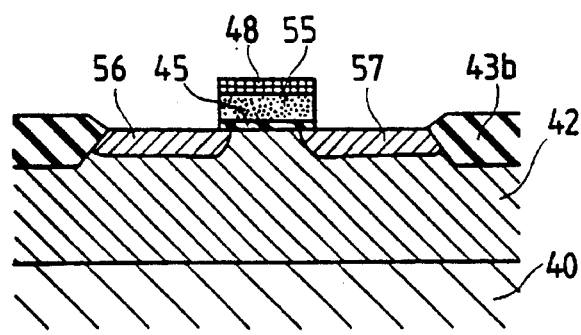
FIG. 6D is a sectional view taken generally along the lines B—B of FIG. 6B.

FIG. 6D is a sectional view taken generally along the lines II—II of FIG. 6B.

As shown in FIG. 6D, after the photoresist mask coated over the entire p-channel MOS transistor zone is taken off, another photoresist mask (not shown) is coated over the entire n-channel MOS transistor zone to prevent impurities from being implanted into the n-channel MOS transistor. Thereafter, BF$_2$ ions are implanted into the polycrystalline silicon film 50 and the n type well region 42 at an accelerating energy of 40 keV and a dose of $6.0 \times 10^{15}$ cm$^{-2}$. Therefore, a polycrystalline silicon film 50 is changed to a p type polycrystalline silicon 55, and the upper side of the n type well region 42 divided by the gate oxide film 45 is changed to a p type diffused layer. In this case, one side of the p type diffused layer divided by the gate oxide film 45 is called a p type source diffused layer 56 because the source diffused layer 56 functions as a source of the p-channel MOS transistor as described later. Also, the other side of the p type diffused layer divided by the gate oxide film 45 is called a p type drain diffused layer 57 because the drain diffused layer 57 functions as a drain of the p-channel MOS transistor as described later. As a result, the p-channel MOS transistor is formed.

Figure 6E:
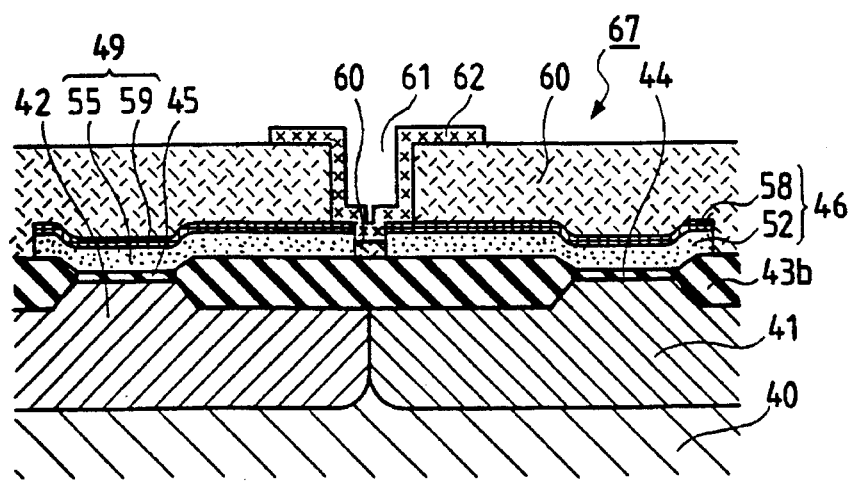
FIG. 6E is a sectional view of a semiconductor apparatus with MOS transistors according to the first embodiment of the present invention, final processes for fabricating gate wiring network being shown.

FIG. 6E is a sectional view of the semiconductor apparatus with MOS transistors according to the first embodiment of the present invention, final processes for fabricating gate wiring network being shown.

As shown in FIG. 6E, after the photoresist mask coated over the entire n-channel MOS transistor zone is taken off, a heat treatment is performed at a temperature of 850° C. for 30 minutes in a nitrogen atmosphere to activate the arsenic ions implanted into both the n type polycrystalline silicon 52 and the p type polycrystalline silicon 55. In addition, the tungsten film 48 is silicified to form a tungsten silicide film 58, and the tungsten film 51 is silicified to form a tungsten silicide film 59. Thereafter, insulating material is deposited over the entire MOS transistors to form a layer insulating film 60 in a thickness of 800 nm by applying the vapor depositing process. Therefore, the gate opening formed on the field oxide layer 43a is filled up with the layer insulating film 60.

Thereafter, the layer insulating film 60 deposited on the gate opening is selectively etched by applying the photolithoglaphy process and the anisotropic dry etching process to form a gate contact hole 61. In this embodiment, because it is difficult to precisely control the depth of the gate contact hole 61, the layer insulating film 60 deposited in the gate opening is etched until the contact hole 61 extends to both the n type polycrystalline silicon film 52 and the p type polycrystalline silicon film 55. Therefore, both the tungsten silicide films 58, 59 are sticked out in the bottom side of the gate contact hole 61. The length of the tungsten silicide films 58, 59 sticked out in the gate contact hole 61 is respectively 0.3 μm.

Thereafter, a metal wiring network 62 is deposited on both the tungsten silicide films 58, 59 sticking out in the gate contact hole 61. Also, the metal wiring network 62 is extended on the layer insulating film 60. Therefore, the tungsten silicide films 58, 59 are electrically connected with the metal wiring network 62.

Figure 6F:
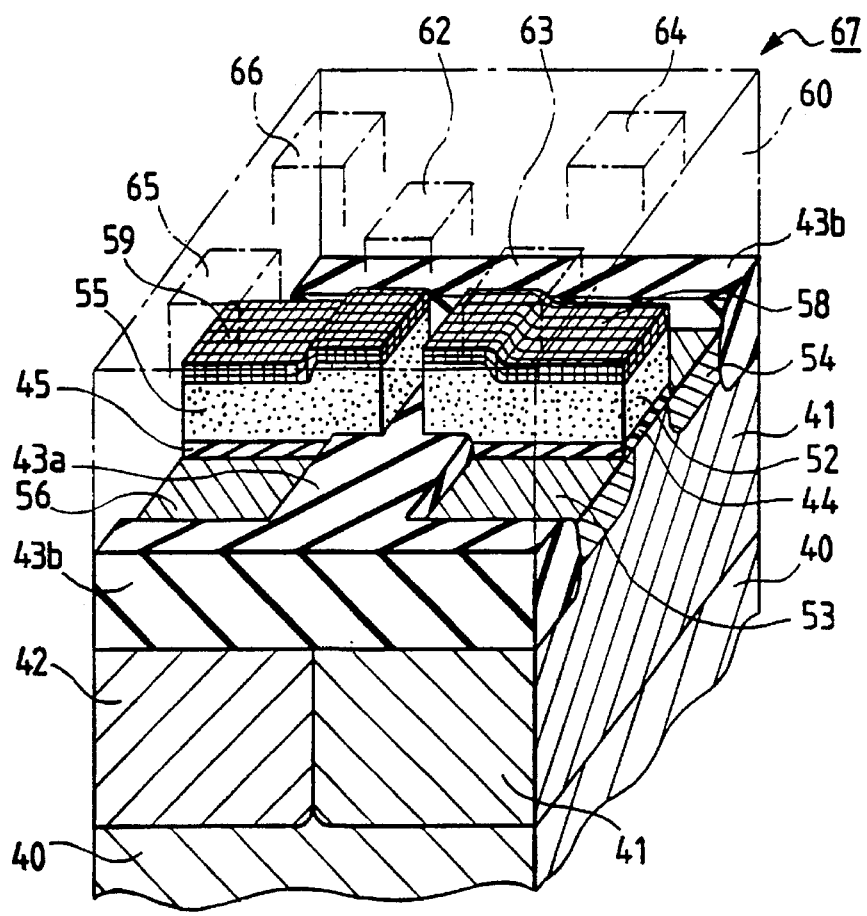
FIG. 6F is a diagonal view of the semiconductor apparatus with MOS transistors shown in FIG. 6E.

In addition, as shown in FIG. 6F, the layer insulating film 60 deposited on the diffused layers 53, 54, 56, and 57 is selectively etched to form four holes at the same time that the gate contact hole 61 is formed. Thereafter, a first source electrode 63 is deposited in the hole positioned on the n type source diffused layer 53, a first drain electrode 64 is deposited in the hole positioned on the n type drain diffused layer 54, a second source electrode 65 is deposited in the hole positioned on the p type source diffused layer 56, and a second drain electrode 66 is deposited in the hole positioned on the p type drain diffused layer 57.

Therefore, electrons provided to the first source electrode 63 are charged to the n type source diffused layer 53 before the electrons are transmitted to the n type drain diffused layer 54 through a gate channel induced by a gate signal externally applied to the n type polycrystalline silicon film 52. Also, holes provided to the second source electrode 65 are charged to the p type source diffused layer 56 before the holes are transmitted to the p type drain diffused layer 57 through a gate channel induced by a gate signal externally applied to the p type polycrystalline silicon film 55.

In the above method, semiconductor apparatus 67 with MOS transistors is completed.

In the above configuration of the semiconductor apparatus 67 shown in FIGS. 6E, 6F, a gate signal is transmitted from the metal wiring network 62 to the polycrystalline silicon films 52, 55 through the tungsten silicide films 58, 59. Therefore, electrons injected in the source diffused layer 53 are transmitted to the drain diffused layer 54 while being controlled in a channel layer which is induced by the gate signal in the p type well region 41 positioned just under the gate oxide film 44. Also, holes injected in the source diffused layer 56 are transmitted to the drain diffused layer 57 while being controlled in another channel layer which is induced by the gate signal in the n type well region 42 positioned just under the gate oxide film 45.

In this case, the gate electrode 46 consisting of both the n type polycrystalline silicon film 52 and the tungsten silicide film 58 is separated from the gate electrode 49 consisting of both the p type polycrystalline silicon film 55 and the tungsten silicide film 59. Also, impurities implanted in the polycrystalline silicon films 52, 55 are not diffused into the metal wiring network 62. Therefore, the arsenic ions implanted in the n type polycrystalline silicon film 52 are not diffused into the p type polycrystalline silicon film 55. Also, the BF$_2$ ions implanted in the p type polycrystalline silicon film 55 are not diffused into the n type polycrystalline silicon film 52.

Therefore, the impurities implanted in the polycrystalline silicon films 52, 55 are stably bonded with silicon atoms so that transistor characteristics indicating the relation between gate voltage and drain current are not varied.

Accordingly, the semiconductor apparatus 67 can be reliably controlled by the gate signal.

In addition, because the tungsten silicide films 58, 59 and the polycrystalline silicon films 52, 55 are patterned at the same time, neither a photolithoglaphy process nor a dry etching process is required to pattern only the tungsten silicide films 58, 59.

Accordingly, the method for manufacturing the semiconductor apparatus 67 with MOS transistors can be simplified.

Figure 7:
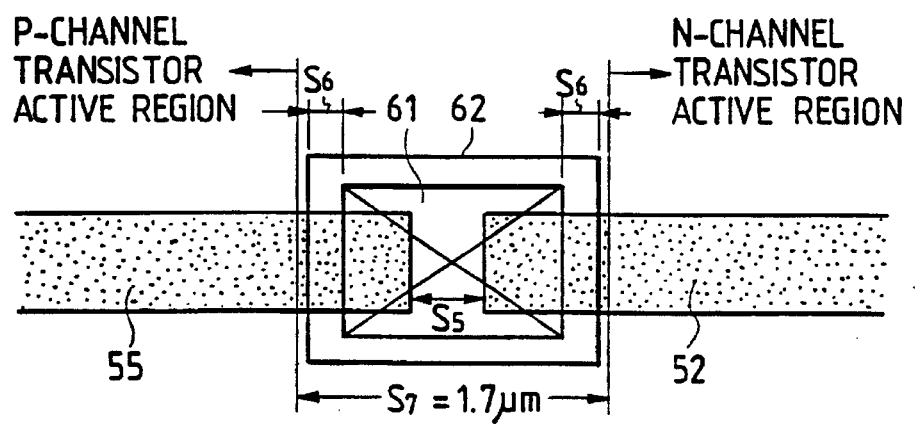
FIG. 7 is a plan view of a gate contact hole in a semiconductor apparatus according to the first to third embodiments.

Also, as shown in FIG. 7, the contact hole 61 is generally required 0.6 µm in diameter to deposit the metal wiring network 62 in the contact hole 61, the space S5 between the polycrystalline silicon films 52, 55 is 0.5 µm according to the present invention, and the marginal space S6 which is required to deposite the metal wiring network 62 on the layer insulating film 60 is generally 0.3µm. Therefore, the distance S7 between the p-channel MOS transistor and the n-channel MOS transistor is only 1.7 µm.

Figure 1:
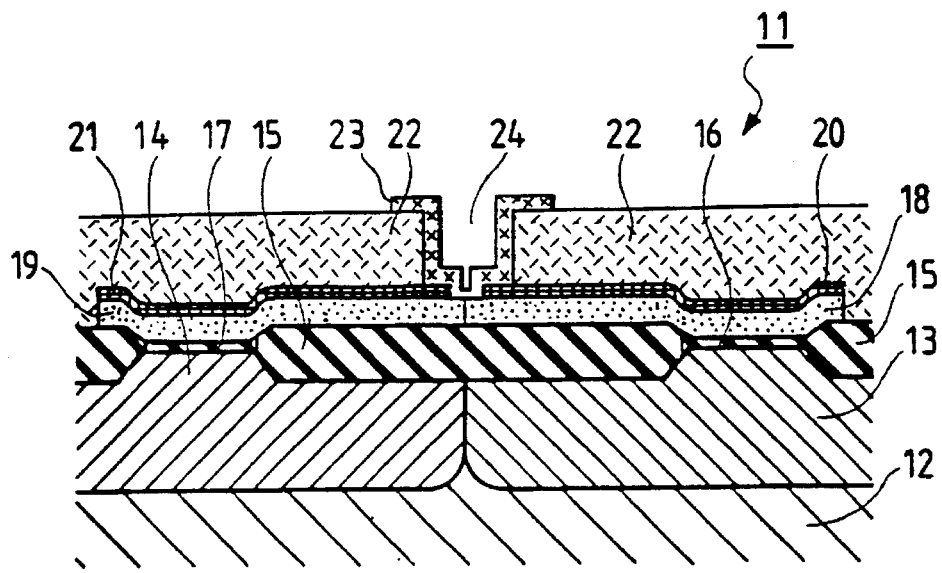
FIG. 1 is a sectional view structurally showing a conventional semiconductor apparatus laid open to public inspection under Japanese Patent Provisional Publication No. 203366/1991 (HEI 3-203366), both a gate region of an n channel MOS transistor and a gate region of a p channel MOS transistor being shown to indicate a boundary region between both gate regions.
Figure 2:
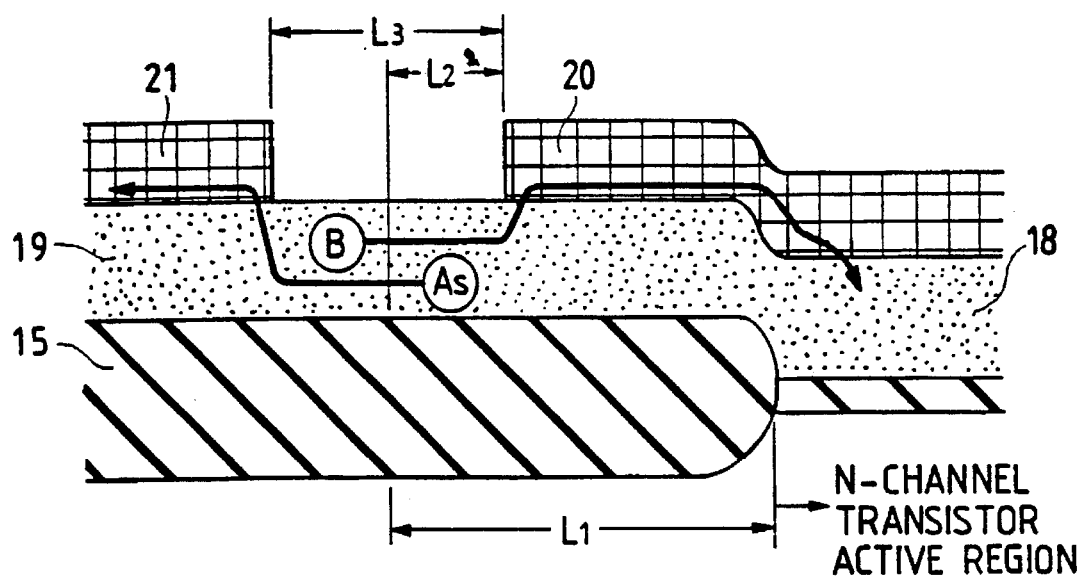
FIG. 2 is a enlarged scale view of polycrystalline silicon films in the semiconductor apparatus shown in FIG. 1, diffusion of impurities being explanatorily shown.
Figure 3:
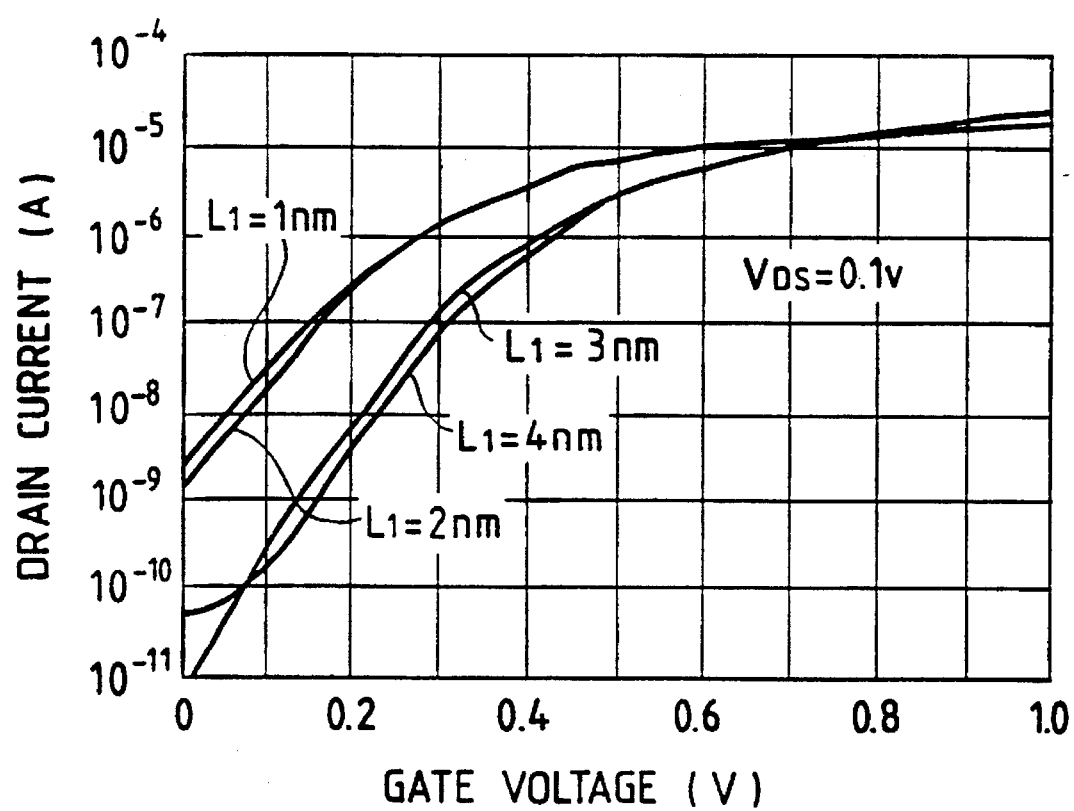
FIG. 3 quantitatively shows the variation of subthreshold characteristics in an n-channel transistor of the semiconductor apparatus 11 shown in FIG. 1 in cases where the distance L1 between a p type polycrystalline silicon film and an active region of the n-channel MOS transistor ranges from 1 μm to 4 μm.
Figure 4:
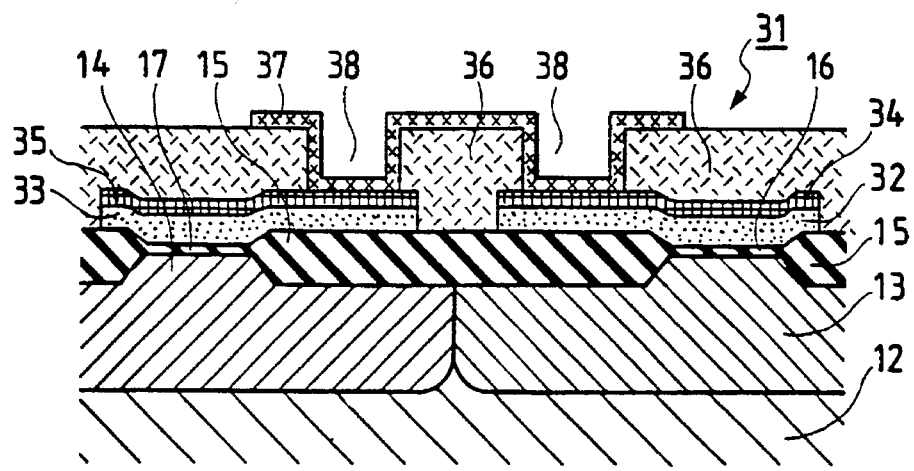
FIG. 4 is a sectional view structurally showing a conventional semiconductor apparatus laid open to public inspection under Japanese Patent Provisional Publication No. 169022/1991 (HEI 3-169022), both a gate region of an n channel MOS transistor and a gate region of a p channel MOS transistor being shown to indicate a boundary region between both gate regions.
Figure 5:
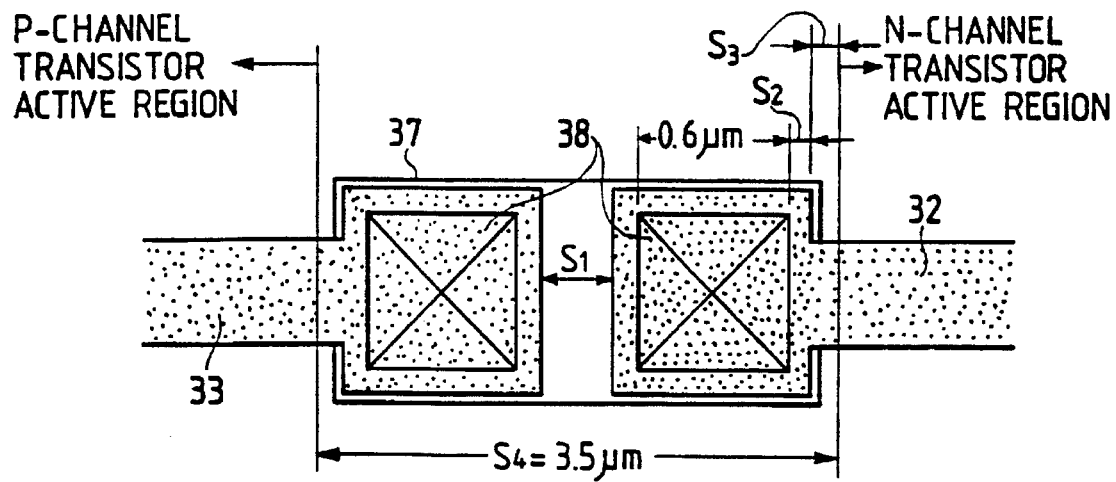
FIG. 5 is a plan view of contact holes in the conventional semiconductor apparatus 31 shown in FIG. 4 numerically showing a space required for the arrangement of the contact holes.

Therefore, the distance S7 is reduced by a factor of 2 as compared with the distance S4 required in the conventional semiconductor apparatus 31 shown in FIG. 4.

Accordingly, the semiconductor apparatus 67 with MOS transistors can be efficiently miniaturized.

2. Second Embodiment

A method for manufacturing a semiconductor apparatus with MOS transistors is initially described with reference to FIGS. 8A to 8F.

Figure 8A:
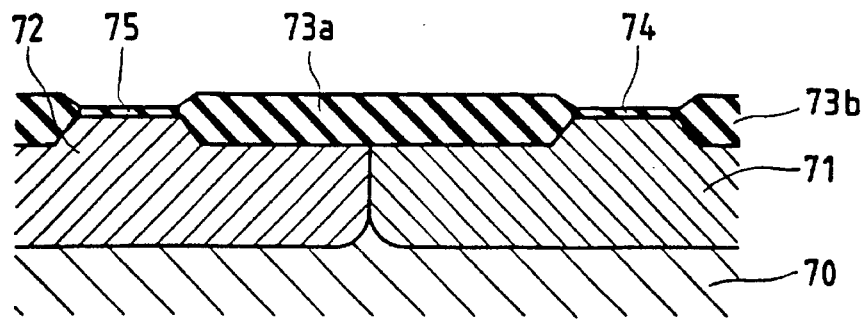
FIG. 8A is a sectional view of layers separating MOS transistors from each other in a semiconductor apparatus with MOS transistors according to a second embodiment of the present invention, initial processes for fabricating the layers being shown.

FIG. 8A is a sectional view of layers separating MOS transistors from each other in a semiconductor apparatus with MOS transistors according to a second embodiment of the present invention, initial processes for fabricating the layers being shown.

As shown in FIG. 8A, impurities such as boron ions are implanted into a part of a p type silicon substrate 70 to form a p type well region 71 by applying the well forming process, and impurities such as arsenic ions are implanted into another part of the p type silicon substrate 70 to form an n type well region 72 by applying the well forming method. In this case, an n-channel MOS transistor is scheduled to be formed on the p type well region 71. Therefore, an area on the n type well region 72 is called an n-channel MOS transistor zone. Also, a p-channel transistor is scheduled to be formed on the n type well region 72. an area on the p type well region 73 is called a p-channel MOS transistor zone. Thereafter, a field oxide layer 73a is formed on a boundary region between the p type well region 71 and the n type well region 72. In addition, other field oxide layers 73b are formed on peripheries of the p type well region 71 and the n type well region 72 to separate the MOS transistors from other devices (not shown) adjacent to the MOS transistors.

Thereafter, a first gate oxide film 74 is formed between the field oxide layer 73a and the field oxide layer 73b to divide the surface of the well region 71 in two. Also, a second gate oxide film 75 is formed between the field oxide layer 73a and the field oxide layer 73b to divide the surface of the well region 72 in two. The gate oxide films 74, 75 are formed in a thickness of 10 nm.

In this case, it is preferable that the gate oxidation films 74, 75 be formed by applying the pyro-technic oxidation process in place of the oxidation process.

Figure 8B:
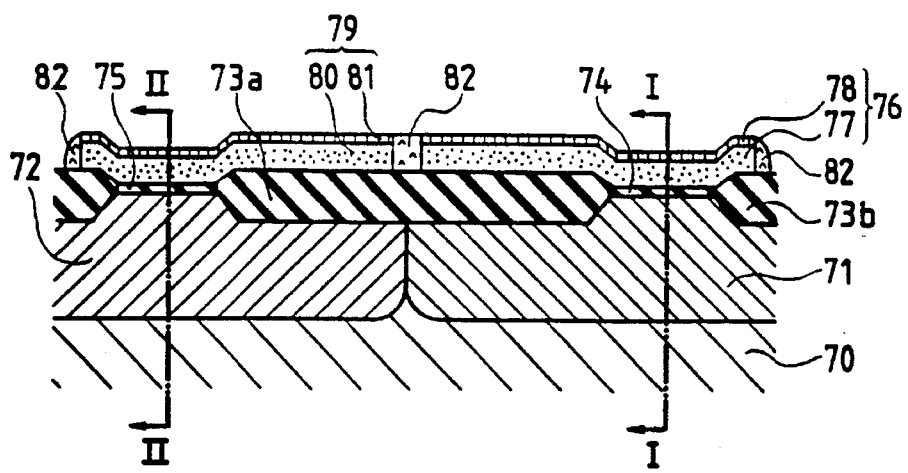
FIG. 8B is a sectional view of gate electrodes of MOS transistors in a semiconductor apparatus with MOS transistors according to the second embodiment of the present invention, middle processes for fabricating the gate electrodes on the gate oxide films being shown.

FIG. 8B is a sectional view of gate electrodes of the MOS transistors in the semiconductor apparatus with MOS transistors according to the second embodiment of the present invention, middle processes for fabricating the gate electrodes on the gate oxide films being shown.

As shown in FIG. 8B, after the gate oxide films 74, 75 are formed, polycrystalline silicon is deposited on the field oxide layers 73a, 73b, the gate oxide films 74, 75, and the well regions 71, 72 by applying the vapor deposition process. Therefore, a polycrystalline silicon film is formed in a thickness of 200 nm. Thereafter, tungsten is deposited on the polycrystalline silicon film by applying the vapor deposition process. Therefore, a tungsten film is formed in a thickness of 150 nm. In this case, it is preferable that the tungsten film be formed by applying the sputtering process in place of the vapor deposition process. Also, it is preferable that metal with a high melting point such as molybdenum and the like be deposited in place of the tungsten.

Thereafter, by applying the photolithoglaphy process, a photoresist film is coated on the tungsten film before the photoresist film is exposed to ultraviolet rays. Therefore, the photoresist film is patterned. Thereafter, the photoresist film, the polycrystalline silicon film and the tungsten film are etched at the same time by applying the anisotropic dry etching process to form a gate opening on the field oxide layer 73a just above a boundary line between the p type well region 71 and the n type well region 72 before the photoresist is washed away. Therefore, a first gate electrode wiring 76 consisting of an etched polycrystalline silicon film 77 and an etched tungsten film 78 is patterned on the first gate oxide film 74 and a part of the field oxide layer 73a. Also, a second gate electrode wiring 79 consisting of an etched polycrystalline silicon film 80 and an etched tungsten film 81 is patterned on the second gate oxide film 75 and a part of the field oxide layer 73a. The width of the gate opening separating the gate electrode wirings 76, 79 from each other is 0.5 μm.

Thereafter, silicon dioxide is deposited on peripheries of both the first and second gate electrode wirings 78, 79 by applying the vapor deposition method in a thickness of 200 nm, then the silicon dioxide is etched to form a side wall oxide layer 82 on a side wall which surrounds the gate electrode wirings 76, 79 by applying the anisotropic dry etching process. Therefore, the gate opening formed on the field oxide layer 73a is filled up with the side wall oxide layer 82. In this case, it is preferable that insulating material such as silicon nitride be deposited over the entire MOS transistor zones in place of the silicon dioxide.

Figure 8C:
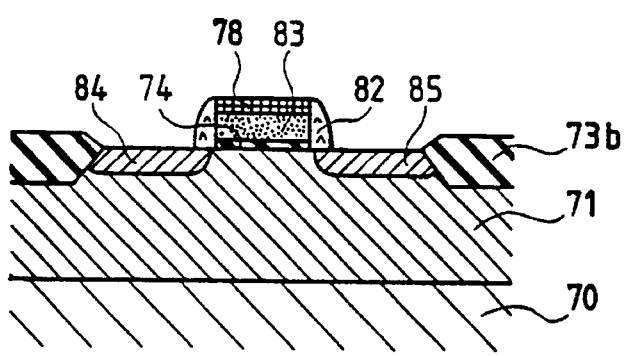
FIG. 8C is a sectional view taken generally along the lines A—A of FIG. 8B.

FIG. 8C is a sectional view taken generally along the lines I—I of FIG. 8B.

As shown in FIG. 8C, after a photoresist mask (not shown) is coated over the p-channel MOS transistor zone to prevent impurities from being implanted into the p-channel MOS transistor zone, arsenic ions are implanted into the polycrystalline silicon film 77 and the p type well region 71 at an accelerating energy of 40 keV and a dose of $4.0 \times 10^{15}$ cm$^{-2}$. Therefore, a polycrystalline silicon film 77 is changed to an n-type polycrystalline silicon 83, and the upper side of the p type well region 71 divided by the gate oxide film 74 is changed to an n type diffused layer.

In this case, one side of the n type diffused layer divided by the gate oxide film 74 is called an n type source diffused layer 84 because the source diffused layer 84 functions as a source of the n-channel MOS transistor as described later. Also, the other side of the n type diffused layer divided by the gate oxide film 74 is called an n type drain diffused layer 85 because the drain diffused layer 85 functions as a drain of the n-channel MOS transistor as described later.

In addition, when the arsenic ions are implanted into the p type well region 71, the upper side of the p type well region 71 positioned just under the side wall oxide layer 82 is weakly changed to the n type. Therefore, a lightly doped drain (LDD) structure is formed in the n-channel transistor. As a result, the short channel effect is effectively suppressed.

Figure 8D:
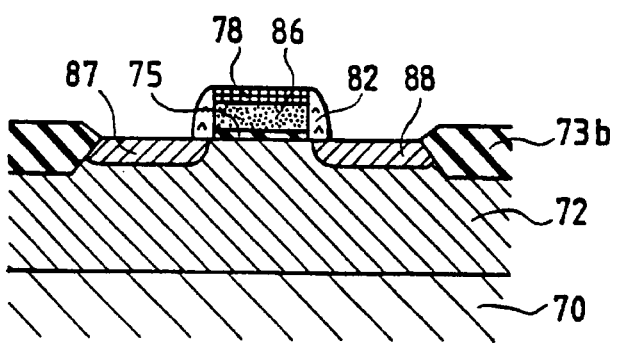
FIG. 8D is a sectional view taken generally along the lines B—B of FIG. 8B.

FIG. 8D is a sectional view taken generally along the lines II—II of FIG. 8B.

As shown in FIG. 8D, after the photoresist mask coated over the entire p-channel MOS transistor zone is taken off, another photoresist mask (not shown) is coated over the entire n-channel MOS transistor zone shown in FIG. 8B to prevent impurities from being implanted into the n-channel MOS transistor. Thereafter, BF$_2$ ions are implanted into the polycrystalline silicon film 80 and the n type well region 72 at an accelerating energy of 40 keV and a dose of $6.0 \times 10^{15}$ cm$^{-2}$. Therefore, a polycrystalline silicon film 80 is changed to a p type polycrystalline silicon 86, and the upper side of the n type well region 72 divided by the gate oxide film 75 is changed to a p type diffused layer.

In this case, one side of the p type diffused layer divided by the gate oxide film 75 is called a p type source diffused layer 87 because the source diffused layer 87 functions as a source of the p-channel MOS transistor as described later. Also, the other side of the p type diffused layer divided by the gate oxide film 75 is called a p type drain diffused layer 88 because the drain diffused layer 88 functions as a drain of the p-channel MOS transistor as described later. As a result, the p-channel MOS transistor is formed.

In addition, when the arsenic ions are implanted into the n type well region 72, the upper side of the n type well region 72 positioned just under the side wall oxide layer 82 is weakly changed to the p type. Therefore, the LDD structure is formed in the p-channel transistor. As a result, the short channel effect is effectively suppressed.

Figure 8E:
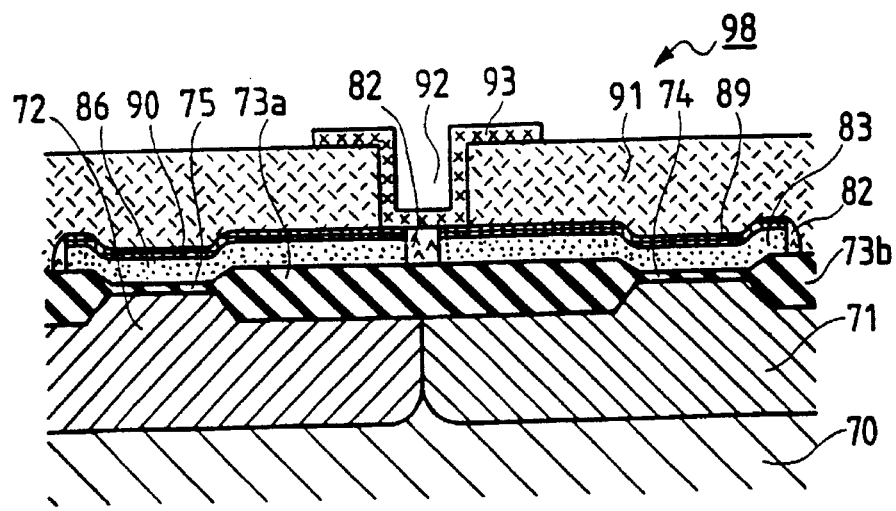
FIG. 8E is a sectional view of a semiconductor apparatus with MOS transistors according to the third embodiment of the present invention, final processes for fabricating gate wiring network being shown.

FIG. 8E is a sectional view of the semiconductor apparatus with MOS transistors according to the second embodiment of the present invention, final processes for fabricating gate wiring network being shown.

As shown in FIG. 8E, after the photoresist mask coated over the entire n-channel MOS transistor zone is taken off, a heat treatment is performed at a temperature of 850° C. for 30 minutes in a nitrogen atmosphere to activate the arsenic ions implanted into both the n type polycrystalline silicon 83 and the p type polycrystalline silicon 86. In addition, the tungsten film 78 is silicified to form a tungsten silicide film 89, and the tungsten film 81 is silicified to form a tungsten silicide film 90. Thereafter, insulating material is deposited over the entire MOS transistors to form a layer insulating film 91 in a thickness of 800 nm by applying the vapor depositing process.

Thereafter, the layer insulating film 91 deposited on the gate opening is selectively etched by applying the photolithoglaphy process and the anisotropic dry etching process to form a gate contact hole 92. In this case, the side wall oxide layer 82 is not etched because the side wall oxide layer 82 is formed of the silicon dioxide. Therefore, the formation of the gate contact hole 92 is stopped when both the tungsten silicide films 89, 90 are exposed at the bottom surface of the gate contact hole 61.

In this embodiment, the width of the gate contact hole 92 is 1.1 μm so that the length of the tungsten silicide films 89, 90 exposed in the gate contact hole 61 is respectively 0.3 μm.

Thereafter, a metal wiring network 93 is deposited on both the tungsten silicide films 89, 90 exposed in the gate contact hole 92. Also, the metal wiring network 93 is extended on the layer insulating film 91. Therefore, the tungsten silicide films 89, 90 are electrically connected with the metal wiring network 93.

Figure 8F:
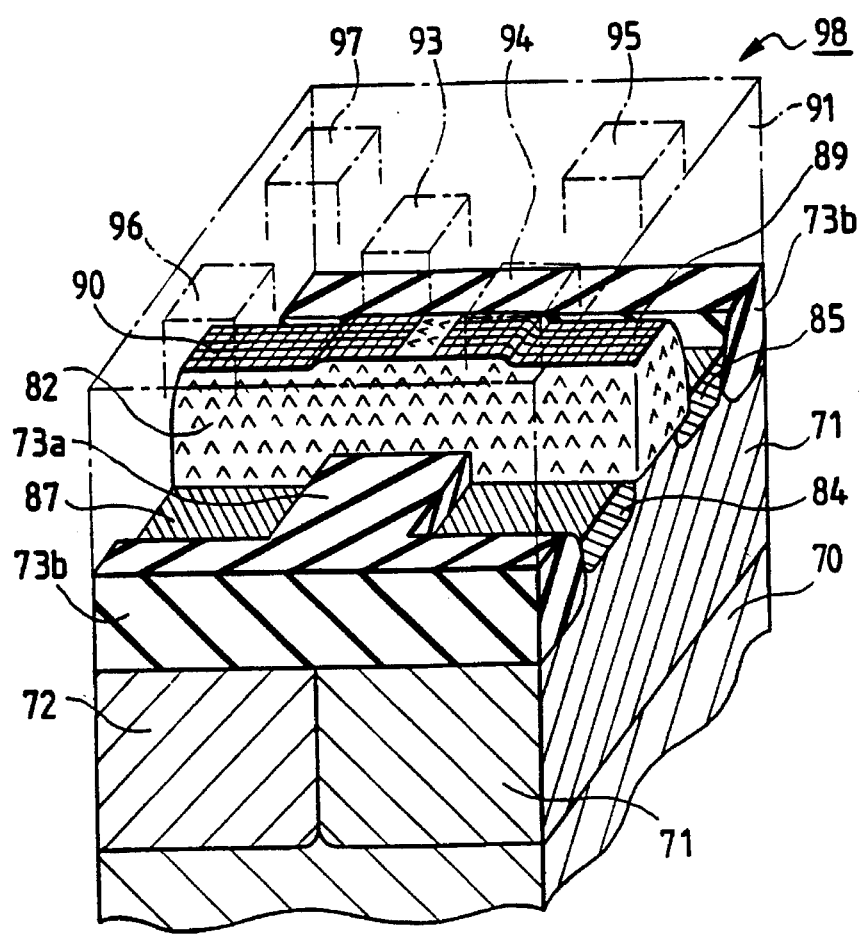
FIG. 8F is a diagonal view of the semiconductor apparatus with MOS transistors shown in FIG. 8E.

In addition, as shown in FIG. 8F, the layer insulating film 91 deposited on the diffused layers 84, 85, 87, and 88 is selectively etched to form four holes at the same time that the gate contact hole 92 is formed. Thereafter, a first source electrode 94 is deposited in the hole positioned on the n type source diffused layer 84, a first drain electrode 95 is deposited in the hole positioned on the n type drain diffused layer 85, a second source electrode 96 is deposited in the hole positioned on the p type source diffused layer 87, and a second drain electrode 97 is deposited in the hole positioned on the p type drain diffused layer 88.

In the above method, semiconductor apparatus 98 with MOS transistors are completed.

In the above configuration of the semiconductor apparatus 98 shown in FIGS. 8E, 8F, a gate signal is transmitted from the metal wiring network 93 to the polycrystalline silicon films 83, 86 through the tungsten silicide films 89, 90. Therefore, electrons injected in the source diffused layer 84 are transmitted to the drain diffused layer 85 while being controlled in a channel layer which is induced by the gate signal in the p type well region 71 positioned just under the gate oxide film 74. Also, holes injected in the source diffused layer 87 are transmitted to the drain diffused layer 88 while being controlled in another channel layer which is induced by the gate signal in the n type well region 72 positioned just under the gate oxide film 75.

In this case, the gate electrode 76 consisting of both the n type polycrystalline silicon film 83 and the tungsten silicide film 89 is separated from the gate electrode 79 consisting of both the p type polycrystalline silicon film 86 and the tungsten silicide film 90. Also, impurities implanted in the polycrystalline silicon films 83, 86 are not diffused into the metal wiring network 93. Therefore, the arsenic ions implanted in the n type polycrystalline silicon film 83 are not diffused into the p type polycrystalline silicon film 86. Also, the $BF_2$ ions implanted in the p type polycrystalline silicon film 86 are not diffused into the n type polycrystalline silicon film 83.

Therefore, the impurities implanted in the polycrystalline silicon films 83, 86 are stably bonded with silicon atoms so that transistor characteristics indicating the relation between gate voltage and drain current are not varied.

Accordingly, the semiconductor apparatus 98 can be reliably controlled by the gate signal.

In addition, because the opening separating the gate electrode wirings 76, 79 from each other is buried with the side wall oxide layer 82 formed of the silicon dioxide, the side wall oxide layer 82 buried in the opening is not etched when the gate contact hole 92 is formed. Therefore, the field oxide layer 73a is not necessarily etched when the gate contact hole 92 is formed.

Accordingly, a gate current flowing from the metal wiring network 93 to the gate electrode wirings 76, 79 does not necessarily leak to the p well region 71 or the n well region 72 because the field oxide layer 73a is not thinned by the etching process.

In this case, because the ratio of etch rates for silicon dioxide and silicon nitride (or selectivity $Si_3N_4/SiO_2$) is very large, the side wall oxide layer 82 formed of the silicon dioxide is hardly etched, while the layer insulating film 91 formed of the silicon nitride is easily etched. Therefore, it is preferable that the layer insulating film 91 be formed of the silicon nitride.

Also, because the tungsten silicide films 89, 90 and the polycrystalline silicon films 83, 86 are patterned at the same time, neither a photolithoglaphy process nor a dry etching process is required to pattern only the tungsten silicide films 89, 90.

Accordingly, the method for manufacturing the semiconductor apparatus 98 with MOS transistors can be simplified.

Furthermore, as shown in FIG. 7, because the distance S7 between the MOS transistors is reduced by a factor of 2 in the same manner as in the semiconductor apparatus 67 of the first embodiment, the semiconductor apparatus 98 with MOS transistors can be efficiently miniaturized.

3. Third Embodiment

A method for manufacturing a semiconductor apparatus with MOS transistors is initially described according to a third embodiment with reference to FIGS. 9A to 9F.

Figure 9A:
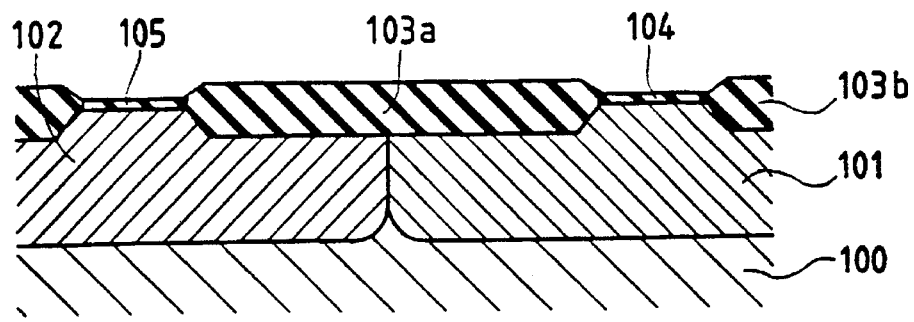
FIG. 9A is a sectional view of layers separating MOS transistors from each other in a semiconductor apparatus with MOS transistors according to a third embodiment of the present invention, initial processes for fabricating the layers being shown.

FIG. 9A is a sectional view of layers separating MOS transistors from each other in a semiconductor apparatus with MOS transistors according to a third embodiment of the present invention, initial processes for fabricating the layers being shown.

As shown in FIG. 9A, impurities such as boron ions are implanted into a part of a p type silicon substrate 100 to form a p type well region 101 by applying the well forming process, and impurities such as arsenic ions are implanted into another part of the p type silicon substrate 100 to form an n type well region 102 by applying the well forming method. In this case, an n-channel MOS transistor is scheduled to be formed on the p type well region 101. Therefore, an area on the n type well region 102 is called an n-channel MOS transistor zone. Also, a p-channel transistor is scheduled to be formed on the n type well region 102. Therefore, an area on the p type well region 103 is called a p-channel MOS transistor zone. Thereafter, a field oxide layer 103a is formed on a boundary region between the p type well region 101 and the n type well region 102. In addition, other field oxide layers 103b are formed on peripheries of the p type well region 101 and the n type well region 102 to separate the MOS transistors from other devices (not shown) adjacent to the MOS transistors.

Thereafter, a first gate oxide film 104 is formed between the field oxide layer 103a and the field oxide layer 103b to divide the surface of the p type well region 101 in two. Also, a second gate oxide film 105 is formed between the field oxide layer 103a and the field oxide layer 103b to divide the surface of the n type well region 102 in two. The gate oxide films 104, 105 are formed in a thickness of 10 nm.

In this case, it is preferable that the gate oxidation films 104, 105 be formed by applying the pyro-technic oxidation process in place of the oxidation process.

Figure 9B:
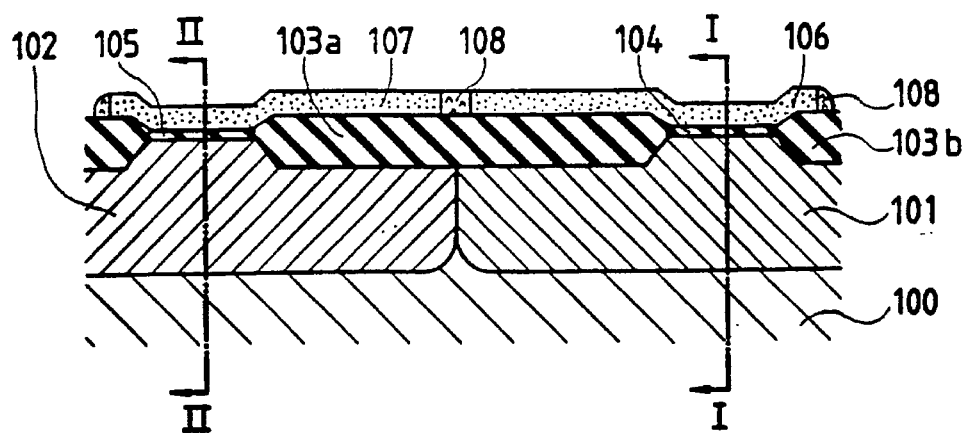
FIG. 9B is a sectional view of gate electrodes of MOS transistors in the semiconductor apparatus with MOS transistors according to the second embodiment of the present invention, middle processes for fabricating the gate electrodes on the gate oxide films being shown.

FIG. 9B is a sectional view of gate electrodes of the MOS transistors in the semiconductor apparatus with MOS transistors according to the second embodiment of the present invention, middle processes for fabricating the gate electrodes on the gate oxide films being shown.

As shown in FIG. 9B, after the gate oxide films 104, 105 are formed, polycrystalline silicon is deposited on the field oxide layers 103a, 103b, the gate oxide films 104, 105, and the well regions 101, 102 by applying the vapor deposition process. Therefore, a polycrystalline silicon film is formed in a thickness of 300 nm. Thereafter, by applying the photolithoglaphy process, a photoresist film is coated on the tungsten film before the photo resist film is exposed to ultraviolet rays. Therefore, the photoresist film is patterned. Thereafter, the photoresist and the polycrystalline silicon film are etched by applying the anisotropic dry etching process to form a gate opening on the field oxide layer 103a just above a boundary line between the p type well region 101 and the n type well region 102 before the photoresist is washed away. Therefore, a polycrystalline silicon film 106 is patterned on the first gate oxide film 104 and a part of the field oxide layer 103a. Also, a polycrystalline silicon film 107 is patterned on the second gate oxide film 105 and a part of the field oxide layer 103a. The width of the gate opening separating the polycrystalline silicon films 106,107 from each other is 0.5 μm.

Thereafter, silicon dioxide is deposited over the entire MOS transistor zones by applying the vapor deposition method in a thickness of 200 nm, then the silicon dioxide is etched to form a side wall oxide layer 108 on a side wall which surrounds the polycrystalline silicon films 106, 107 by applying the anisotropic dry etching process. Therefore, the gate opening formed on the field oxide layer 103a is filled up with the side wall oxide layer 108. In this case, it is preferable that insulating material such as silicon nitride be deposited over the entire MOS transistor zones in place of the silicon dioxide.

Figure 9C:
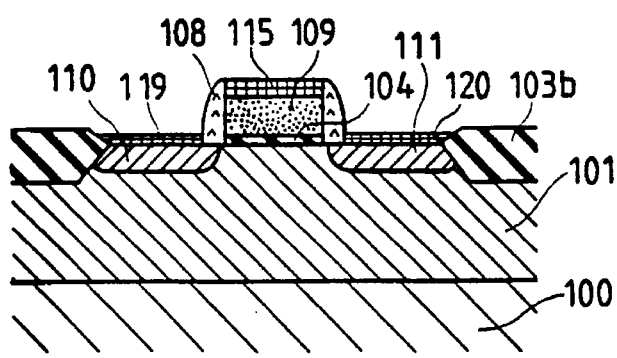
FIG. 9C is a sectional view taken generally along the lines A—A of FIG. 9B.
Figure 9D:
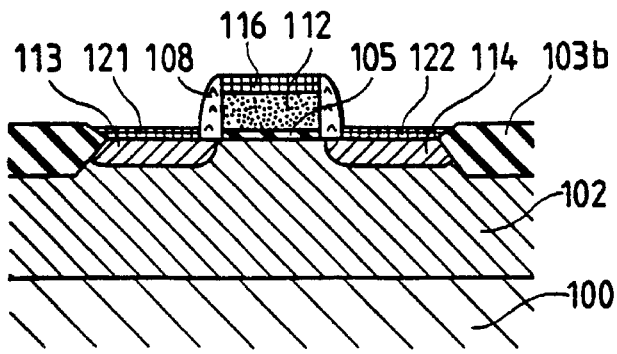
FIG. 9D is a sectional view taken generally along the lines B—B of FIG. 9B.

FIG. 9C is a sectional view taken generally along the lines I—I of FIG. 9B, and FIG. 9D is a sectional view taken generally along the lines II—II of FIG. 9B.

As shown in FIG. 9C, after a photoresist mask (not shown) is coated over the p-channel MOS transistor zone to prevent impurities from being implanted into the p-channel MOS transistor zone, arsenic ions are implanted into the polycrystalline silicon film 106 and the p type well region 101 at an accelerating energy of 40 keV and a dose of $4.0 \times 10^{15}$ cm$^{-2}$. Therefore, a polycrystalline silicon film 106 is changed to an n-type polycrystalline silicon film 109, and the upper side of the p type well region 101 divided by the gate oxide film 104 is changed to an n type diffused layer. In this case, one side of the n type diffused layer divided by the gate oxide film 104 is called an n type source diffused layer 110 because the source diffused layer 110 functions as a source of the n-channel MOS transistor as described later. Also, the other side of the n type diffused layer divided by the gate oxide film 104 is called an n type drain diffused layer 111 because the drain diffused layer 111 functions as a drain of the n-channel MOS transistor as described later.

After the photoresist mask coated over the entire p-channel MOS transistor zone is taken off, another photoresist mask (not shown) is coated over the entire n-channel MOS transistor zone to prevent impurities from being implanted into the n-channel MOS transistor zone. Thereafter, BF$_2$ ions are implanted into the polycrystalline silicon film 107 at an accelerating energy of 40 keV and a dose of $6.0 \times 10^{15}$ cm$^{-2}$. Therefore, as shown in FIG. 9D, a polycrystalline silicon film 107 is changed to a p type polycrystalline silicon film 112, and the upper side of the n type well region 102 divided by the gate oxide film 105 is changed to a p type diffused layer. In this case, one side of the p type diffused layer divided by the gate oxide film 105 is called a p type source diffused layer 113 because the source diffused layer 113 functions as a source of the p-channel MOS transistor as described later. Also, the other side of the p type diffused layer divided by the gate oxide film 105 is called a p type drain diffused layer 114 because the drain diffused layer 114 functions as a drain of the p-channel MOS transistor as described later.

After the photoresist mask coated over the entire n-channel MOS transistor zone is taken off, titanium is selectively deposited on the polycrystalline silicon films 109, 112 and the source and drain diffused layers 110, 111, 113, and 114 at a time by applying the sputtering process. Therefore, a titanium film is formed in a thickness of 50 nm.

Thereafter, by applying a well-known ramp annealing process, a heat treatment is performed at a temperature of 800° C. for 60 seconds in a nitrogen atmosphere to activate impurities such as the arsenic ions or the BF$_2$ ions implanted into the n type polycrystalline silicon film 109 and the p type polycrystalline silicon film 112. In addition, the titanium film deposited on the n type polycrystalline silicon film 109 is silicified to form a titanium silicide film 115, and the titanium film deposited on the p type polycrystalline silicon film 112 is silicified to form a titanium silicide film 116. Therefore, a gate electrode wiring 117 consisting of the n type polycrystalline silicon film 109 and the titanium silicide film 115 is formed in the n type MOS transistor, and a gate electrode wiring 118 consisting of the p type polycrystalline silicon film 112 and the titanium silicide film 116 is formed in the p type MOS transistor.

Also, the titanium film deposited on the n type source diffused layer 110 is silicified to form a titanium silicide source film 119, the titanium film deposited on the n type drain diffused layer 111 is silicified to form a titanium silicide drain film 120, the titanium film deposited on the p type source diffused layer 113 is silicified to form a titanium silicide source film 121, and the titanium film deposited on the p type drain diffused layer 114 is silicified to form a titanium silicide drain film 122. After forming titanium silicide films, the titanium film not combined with the silicon are take off with a sulfuric acid/hydrogen peroxide solution ($H_2SO_4$—$H_2O_2$—$H_2O$).

In the above processes shown in FIGS. 9C, 9D, the ion implantation process is performed prior to the silicification process. However, it is preferable that the silicification process be performed prior to the ion implantation process.

Figure 9E:
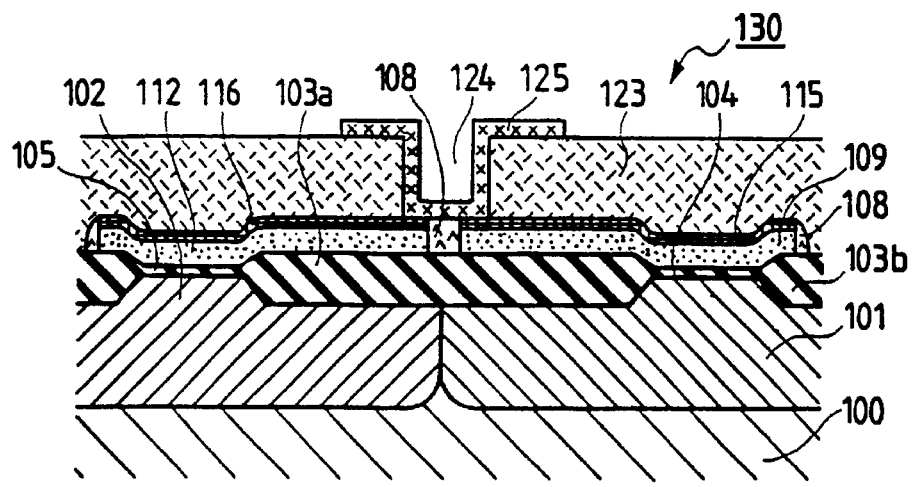
FIG. 9E is a sectional view of a semiconductor apparatus with MOS transistors according to the third embodiment of the present invention, final processes for fabricating gate wiring network being shown.

FIG. 9E is a sectional view of the semiconductor apparatus with MOS transistors according to the third embodiment of the present invention, final processes for fabricating gate wiring network being shown.

As shown in FIG. 9E, insulating material is deposited over the entire MOS transistors to form a layer insulating film 123 in a thickness of 800 nm by applying the vapor depositing process.

Thereafter, the layer insulating film 123 deposited on the gate opening is selectively etched by applying the photolithoglaphy process and the anisotropic dry etching process to form a gate contact hole 124. In this case, the side wall oxide layer 108 is not etched because the side wall oxide layer 82 is formed of the silicon dioxide. Therefore, the formation of the gate contact hole 92 is stopped when both the titanium silicide films 115, 116 are exposed at the bottom surface of the gate contact hole 124.

In this embodiment, the width of the gate contact hole 92 is 1.1 µm so that the length of the titanium silicide films 115, 116 exposed in the gate contact hole 124 is respectively 0.3 µm.

Thereafter, a metal wiring network 125 is deposited on both the titanium silicide films 115, 116 exposed in the gate contact hole 124. Also, the metal wiring network 125 is extended on the layer insulating film 123. Therefore, the titanium silicide films 115, 116 are electrically connected with the metal wiring network 125.

Figure 9F:
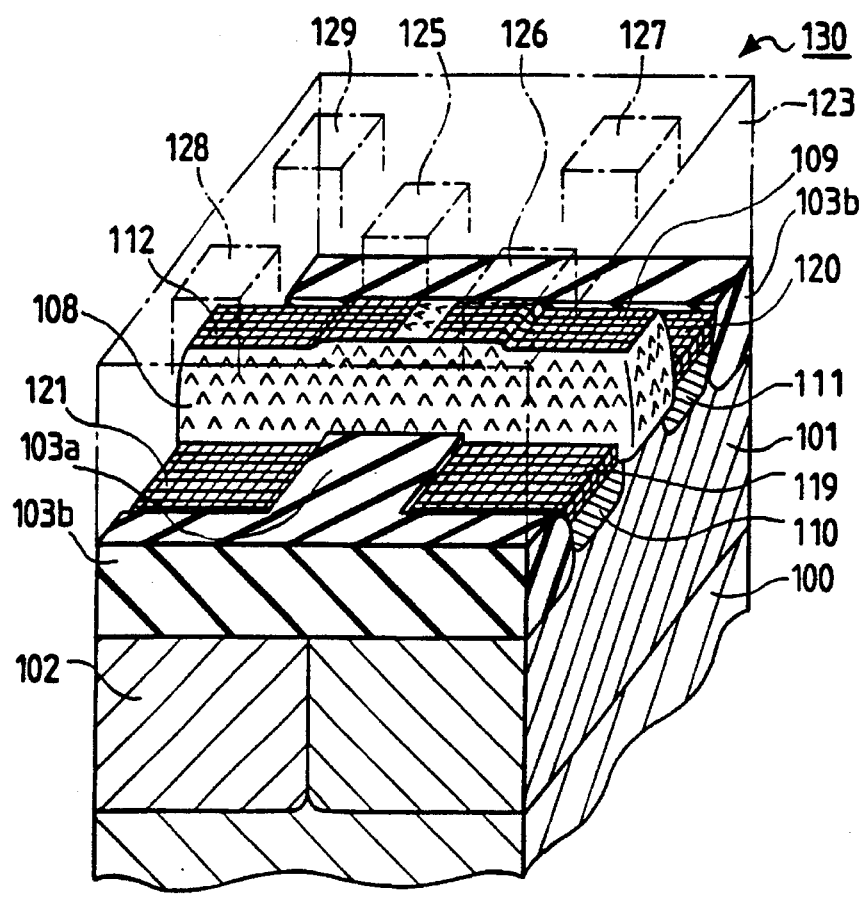
FIG. 9F is a diagonal view of the semiconductor apparatus with MOS transistors shown in FIG. 9E.

In addition, as shown in FIG. 9F, tile layer insulating film 123 deposited on the titanium silicide films 119, 120, 121 and 122 is selectively etched to form four holes at the same time that the gate contact hole 124 is formed. Thereafter, a first source electrode wiring network 126 is deposited in the hole positioned on the titanium silicide film 119, a first drain electrode wiring network 127 is deposited in the hole positioned on the titanium silicide film 120, a second source electrode wiring network 128 is deposited in the hole positioned on the titanium silicide film 121, and a second drain electrode wiring network 129 is deposited in the hole positioned on the titanium silicide film 122.

In the above method, semiconductor apparatus 130 with MOS transistors are completed.

In the above configuration of the semiconductor apparatus 130 shown in FIGS. 9E, 9F, a gate signal is transmitted from the metal wiring network 125 to the polycrystalline silicon films 109, 112 through the titanium silicide films 115, 116. Therefore, electrons injected in the source diffused layer 110 are transmitted to the drain diffused layer 111 while being controlled in a channel layer which is induced by the gate signal in the p type well region 101 positioned just under the gate oxide film 104. Also, holes injected in the source diffused layer 113 are transmitted to the drain diffused layer 114 while being controlled in another channel layer which is induced by the gate signal in the n type well region 102 positioned just under the gate oxide film 105.

In this case, the gate electrode wiring 117 consisting of both the n type polycrystalline silicon film 109 and the titanium silicide film 115 is separated from the gate electrode wiring 118 consisting of both the p type polycrystalline silicon film 112 and the titanium silicide film 116. Also, impurities implanted in the polycrystalline silicon films 109, 112 are not diffused into the metal wiring network 125. Therefore, the arsenic ions implanted in the n type polycrystalline silicon film 109 are not diffused into the p type polycrystalline silicon film 112. Also, the $BF_2$ ions implanted in the p type polycrystalline silicon film 112 are not diffused into the n type polycrystalline silicon film 109.

Therefore, the impurities implanted in the polycrystalline silicon films 109, 112 are stably bonded with silicon atoms so that transistor characteristics indicating the relation between gate voltage and drain current are not varied.

Accordingly, the semiconductor apparatus 130 can be reliably controlled by the gate signal.

In addition, because the gate opening separating the gate electrode wirings 117, 118 from each other is buried with the side wall oxide layer 108 formed of the silicon dioxide, the side wall oxide layer 108 buried in the gate opening is not etched when the gate contact hole 124 is formed. Therefore, the field oxide layer 103a is not necessarily etched when the gate contact hole 124 is formed.

Accordingly, a gate current flowing from the metal wiring network 125 to the gate electrode wirings 117, 118 does not necessarily leak to the p well region 101 or the n well region 102 because the field oxide layer 103a is not thinned by the etching process.

In this case, because the ratio of etch rates for silicon dioxide and silicon nitride (or selectivity $Si_3N_4/SiO_2$) is very large, it is preferable that the layer insulating film 123 be formed of the silicon nitride.

Also, because the titanium silicide films 115, 116 and the titanium silicide films 119, 120, 121 and 122 are selectively deposited at the same time, neither a photolithoglaphy process nor a dry etching process is required to selectively deposite only the tungsten silicide films 115, 116.

Accordingly, the method for manufacturing the semiconductor apparatus 130 with MOS transistors can be simplified.

Furthermore, as shown in FIG. 7, because the distance S7 between the MOS transistors is reduced by a factor of 2 in the same manner as in the semiconductor apparatus 67 of the first embodiment, the semiconductor apparatus 130 with MOS transistors can be efficiently miniaturized.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor apparatus with metal-oxide-semiconductor (MOS) transistors for transmitting electrons through a first channel region from an n the source layer adjacent to a side of the first channel region to an n type drain layer adjacent to an opposite side of the first channel region in an n-channel MOS transistor and transmitting holes through a second channel region from a p type source layer adjacent to a side of the second channel region to a p type drain layer adjacent to an opposite side of the second channel region in a p-channel MOS transistor, comprising:

a field oxide layer arranged on a boundary region between the n-channel MOS transistor and the p-channel MOS transistor for electrically insulating the n-channel MOS transistor from the p-channel MOS transistor;

a first gate oxide film arranged on the first channel region of the n-channel MOS transistor in contact with the field oxide layer;

a second gate oxide film arranged on the second channel region of the p-channel MOS transistor in contact with the field oxide layer;

an n type polycrystalline silicon film arranged on the first gate oxide and the field oxide layer, the n type polycrystalline silicon film functioning as an n type gate electrode;

a first silicide metal film with a high melting point arranged on the n type polycrystalline silicon film;

a p type polycrystalline silicon film arranged on both the second gate oxide and the field oxide layer, one end of the p type polycrystalline silicon film and one end of the n type polycrystalline silicon film being spaced apart and having an insulating material therebetween, and the p type polycrystalline silicon film functioning as a p type gate electrode;

a second silicide metal film with a high melting point arranged on the p type polycrystalline silicon film and facing one end of the first silicide metal film through the insulating material, an upper level of the insulating material being lower than those of the first and second silicide metal films;

an insulating film arranged on both the first and second silicide metal films, a single gate contact hole being formed within the insulating film and reaching one end of the first silicide metal film and one end of the second silicide metal film which face each other through the insulating material, and the single gate contact hole being placed on the insulating material; and a gate metal wiring arranged in the gate contact hole for electrically connecting the first silicide metal film and the second silicide metal film to provide a gate signal to both the n type and p type polycrystalline silicon films through both the first and second silicide metal films, the gate metal wiring being in contact with not only upper surfaces of the first and second silicide metal films but also side surfaces of the first and second silicide metal films to widen a contact surface of the gate metal wiring with each of the first and second silicide metal films, the electrons which transmit through the first channel region from the n type source layer to the n type drain layer being controlled by the gate signal provided to the n type polycrystalline silicon film positioned above the first channel region, and the holes which transmit through the second channel region from the p type source layer to the p type drain layer being controlled by the gate signal provided to the p type polycrystalline silicon film positioned above the second channel region.

2. An apparatus according to claim 1 in which the insulating material through which the n type polycrystalline silicon is separated from the p type polycrystalline silicon is formed of silicon dioxide.

3. An apparatus according to claim 1 in which the first and second silicide metals are formed of tungsten silicide.

4. An apparatus according to claim 1 in which the first and second silicide metals are formed of titanium silicide.

5. An apparatus according to claim 1 in which the first and second silicide metals are formed of molybdenum silicide.

6. A semiconductor apparatus with metal-oxide-semiconductor (MOS) transistors for transmitting electrons through a first channel region from an n type source layer adjacent to a side of the first channel region to an n type drain layer adjacent to an opposite side of the first channel region in an n-channel MOS transistor and transmitting holes through a second channel region from a p type source layer adjacent to a side of the second channel region to a p type drain layer adjacent to an opposite side of the second channel region in a p-channel MOS transistor, comprising;

a field oxide layer arranged on a boundary region between the n-channel MOS transistor and the p-channel MOS transistor for electrically insulating the n-channel MOS transistor from the p-channel MOS transistor;

a first gate oxide film arranged on the first channel region of the n-channel MOS transistor in contact with the field oxide layer;

a second gate oxide film arranged on the second channel region of the p-channel MOS transistor in contact with the field oxide layer;

an n type polycrystalline silicon film arranged on the first gate oxide and the field oxide layer, the n type polycrystalline silicon film having a thickness of 200 nm;

a first silicide metal film with a high melting point arranged on the n type polycrystalline silicon film, the first silicide metal film having a thickness of 150 nm;

a p type polycrystalline silicon film which is arranged on both the second gate oxide and the field oxide layer and faces one end of the n type polycrystalline silicon through an insulating material positioned on the field oxide layer, the p type polycrystalline silicon film having a thickness of 200 nm;

a second silicide metal film with a high melting point arranged on the p type polycrystalline silicon film and facing one end of the first silicide metal film through the insulating material, the second silicide metal film having a thickness of 150 nm;

an insulating film arranged on both the first and second silicide metal films, a gate contact hole being formed within the insulating film and reaching one end of the first silicide metal film and one end of the second silicide metal film which face each other through the insulating material; and a gate metal wiring arranged in the gate contact hole for electrically connecting the first silicide metal film and the second silicide metal film to provide a gate signal to both the n type and p type polycrystalline silicon films through both the first and second silicide metal films, the electrons which transmit through the first channel region from the n type source layer to the n type drain layer being controlled by the gate signal provided to the n type polycrystalline silicon film positioned above the first channel region, and the holes which transmit through the second channel region from the p type source layer to the p type drain layer being controlled by the gate signal provided to the p type polycrystalline silicon film positioned above the second channel region.

7. An apparatus according to claim 1 in which the space between the n and p type polycrystalline silicon film is 0.5 μm and the diameter of the gate contact hole in which the gate metal wiring is formed is 1.1 μm.

8. An apparatus according to claim 1 in which arsenic ions are included in the n type polycrystalline silicon film as a n type impurities and boron fluoride ($BF_2$) ions are included in the p type polycrystalline silicon film as p type impurities.

* * * * *